US008749054B2

(12) United States Patent
de Rochemont

(10) Patent No.: US 8,749,054 B2
(45) Date of Patent: Jun. 10, 2014

(54) SEMICONDUCTOR CARRIER WITH VERTICAL POWER FET MODULE

(76) Inventor: L. Pierre de Rochemont, Austin, TX (US)

( * ) Notice: Subject to any disclaimer, the term of this patent is extended or adjusted under 35 U.S.C. 154(b) by 0 days.

(21) Appl. No.: 13/168,922

(22) Filed: Jun. 24, 2011

(65) Prior Publication Data

US 2011/0316612 A1    Dec. 29, 2011

Related U.S. Application Data

(60) Provisional application No. 61/358,040, filed on Jun. 24, 2010, provisional application No. 61/359,091, filed on Jun. 28, 2010.

(51) Int. Cl.
*H01L 23/34* (2006.01)

(52) U.S. Cl.
USPC ............. 257/724; 257/300; 257/14; 257/254; 257/296; 257/330; 363/17; 336/200; 428/615; 327/372; 343/873

(58) Field of Classification Search
CPC ....... H02J 5/005; H01L 28/10; H01L 23/645; H01L 24/95; H01L 27/06; H01L 27/0629; H02H 3/33; H05B 33/0815; H05B 41/391; G08C 23/06
USPC ........... 257/724, 664, 300, 14, 254, 296, 330; 361/268–270; 363/17; 336/200; 428/615; 327/372; 343/873
See application file for complete search history.

(56) References Cited

U.S. PATENT DOCUMENTS

| 2,283,925 | A | | 5/1942 | Harvey |
| 2,886,529 | A | | 5/1959 | Louis |
| 3,302,038 | A | * | 1/1967 | Wine ............................ 327/372 |
| 3,574,114 | A | | 4/1971 | Monforte |
| 3,614,554 | A | | 10/1971 | Shield et al. |
| 3,983,077 | A | | 9/1976 | Fuller et al. |
| 4,400,683 | A | | 8/1983 | Eda et al. |
| 4,455,545 | A | | 6/1984 | Shelly |
| 4,523,170 | A | | 6/1985 | Huth, III |
| 4,646,038 | A | | 2/1987 | Wanat |

(Continued)

FOREIGN PATENT DOCUMENTS

| EP | 0026056 | A1 | 4/1981 |
| EP | 0939451 | A1 | 1/1999 |
| EP | 1376759 | A2 | 2/2004 |
| GB | 1125897 | A | 9/1968 |

OTHER PUBLICATIONS

Andrenko, A.S. et al. EM Analysis of PBG Substrate Microstrip Circuits for Integrated Transmitter Front End. MMET 2000 Proceedings pp. 295-297.

(Continued)

*Primary Examiner* — Fernando L Toledo
*Assistant Examiner* — Mohammed Shamsuzzaman
(74) *Attorney, Agent, or Firm* — Burns & Levinson LLP; Jacob N. Erlich; David W. Gomes

(57) ABSTRACT

A monolithic power switch provides a semiconductor layer, a three dimensional FET formed in the semiconductor layer to modulate currents through the semiconductor layer, and a toroidal inductor with a ceramic magnetic core formed on the semiconductor layer around the FET and having a first winding connected to the FET.

19 Claims, 22 Drawing Sheets

(56) References Cited

U.S. PATENT DOCUMENTS

| | | |
|---|---|---|
| 4,759,120 A | 7/1988 | Bernstein |
| 4,859,492 A | 8/1989 | Rogers, Jr. et al. |
| 4,880,770 A | 11/1989 | Mir et al. |
| 4,967,201 A | 10/1990 | Rich, III |
| 5,070,317 A * | 12/1991 | Bhagat .......... 336/200 |
| 5,084,749 A | 1/1992 | Losee et al. |
| 5,130,675 A | 7/1992 | Sugawara |
| 5,139,999 A | 8/1992 | Gordon et al. |
| 5,154,973 A | 10/1992 | Imagawa et al. |
| 5,198,824 A | 3/1993 | Poradish |
| 5,217,754 A | 6/1993 | Santiago-Aviles et al. |
| 5,219,377 A | 6/1993 | Poradish |
| 5,263,198 A | 11/1993 | Geddes et al. |
| 5,272,485 A | 12/1993 | Mason et al. |
| 5,403,797 A | 4/1995 | Ohtani et al. |
| 5,427,988 A | 6/1995 | Sengupta et al. |
| 5,456,945 A | 10/1995 | McMillan et al. |
| 5,478,610 A | 12/1995 | Desu et al. |
| 5,513,382 A | 4/1996 | Agahi-Kesheh et al. |
| 5,535,445 A | 7/1996 | Gunton |
| 5,540,772 A | 7/1996 | McMillan et al. |
| 5,543,773 A | 8/1996 | Evans et al. |
| 5,584,053 A | 12/1996 | Kommrusch et al. |
| 5,590,387 A | 12/1996 | Schmidt et al. |
| 5,614,252 A | 3/1997 | McMillan et al. |
| 5,625,365 A | 4/1997 | Tom et al. |
| 5,631,494 A | 5/1997 | Sakurai et al. |
| 5,635,433 A | 6/1997 | Sengupta |
| 5,707,459 A | 1/1998 | Itoyama et al. |
| 5,707,715 A | 1/1998 | deRochemont et al. |
| 5,747,870 A | 5/1998 | Pedder |
| 5,759,923 A | 6/1998 | McMillan et al. |
| 5,764,189 A | 6/1998 | Lohninger |
| 5,771,567 A | 6/1998 | Pierce et al. |
| 5,854,608 A | 12/1998 | Leisten |
| 5,859,621 A | 1/1999 | Leisten |
| 5,888,583 A | 3/1999 | McMillan et al. |
| 5,889,459 A | 3/1999 | Hattori et al. |
| 5,892,489 A | 4/1999 | Kanba et al. |
| 5,903,421 A | 5/1999 | Furutani et al. |
| 5,933,121 A | 8/1999 | Rainhart et al. |
| 5,945,963 A | 8/1999 | Leisten |
| 6,023,251 A | 2/2000 | Koo et al. |
| 6,027,826 A | 2/2000 | deRochemont |
| 6,028,568 A | 2/2000 | Asakura et al. |
| 6,031,445 A | 2/2000 | Marty et al. |
| 6,040,805 A | 3/2000 | Huynh et al. |
| 6,046,707 A | 4/2000 | Gaughan et al. |
| 6,052,040 A | 4/2000 | Hino |
| 6,111,544 A | 8/2000 | Dakeya et al. |
| 6,143,432 A | 11/2000 | de Rochemont et al. |
| 6,154,176 A | 11/2000 | Fathy et al. |
| 6,176,004 B1 | 1/2001 | Rainhart et al. |
| 6,181,297 B1 | 1/2001 | Leisten |
| 6,188,368 B1 | 2/2001 | Koriyama et al. |
| 6,195,049 B1 | 2/2001 | Kim et al. |
| 6,204,203 B1 | 3/2001 | Narwankar et al. |
| 6,205,200 B1 * | 3/2001 | Boyer et al. .......... 378/101 |
| 6,208,843 B1 | 3/2001 | Huang et al. |
| 6,222,489 B1 | 4/2001 | Tsuru et al. |
| 6,266,020 B1 | 7/2001 | Chang |
| 6,271,803 B1 | 8/2001 | Watanabe et al. |
| 6,300,894 B1 | 10/2001 | Lynch et al. |
| 6,320,547 B1 | 11/2001 | Fathy et al. |
| 6,323,549 B1 | 11/2001 | deRochemont et al. |
| 6,492,949 B1 | 12/2002 | Breglia et al. |
| 6,496,149 B1 | 12/2002 | Birnbaum et al. |
| 6,501,415 B1 | 12/2002 | Viana et al. |
| 6,515,369 B1 * | 2/2003 | Lin ............... 257/773 |
| 6,541,820 B1 | 4/2003 | Bol |
| 6,552,693 B1 | 4/2003 | Leisten |
| 6,559,735 B1 | 5/2003 | Hoang et al. |
| 6,583,699 B2 | 6/2003 | Yokoyama |
| 6,605,151 B1 | 8/2003 | Wessels et al. |
| 6,611,419 B1 | 8/2003 | Chakravorty |
| 6,620,750 B2 | 9/2003 | Kim et al. |
| 6,639,556 B2 | 10/2003 | Baba |
| 6,642,908 B2 | 11/2003 | Pleva et al. |
| 6,650,303 B2 | 11/2003 | Yoon et al. |
| 6,670,497 B2 | 12/2003 | Tashino et al. |
| 6,680,700 B2 | 1/2004 | Hilgers |
| 6,683,576 B2 | 1/2004 | Achim |
| 6,686,406 B2 | 2/2004 | Tomomatsu et al. |
| 6,690,336 B1 | 2/2004 | Leisten et al. |
| 6,697,605 B1 | 2/2004 | Atokawa et al. |
| 6,742,249 B2 | 6/2004 | deRochemont et al. |
| 6,743,744 B1 | 6/2004 | Kim et al. |
| 6,762,237 B2 | 7/2004 | Glatkowski et al. |
| 6,791,496 B1 | 9/2004 | Killen et al. |
| 6,864,848 B2 | 3/2005 | Sievenpiper |
| 6,876,056 B2 * | 4/2005 | Tilmans et al. ........... 257/528 |
| 6,906,674 B2 | 6/2005 | McKinzie, III et al. |
| 6,919,119 B2 | 7/2005 | Kalkan et al. |
| 7,047,637 B2 | 5/2006 | deRochemont et al. |
| 7,135,952 B2 * | 11/2006 | Harding .......... 336/200 |
| 7,167,073 B2 * | 1/2007 | Hatano .......... 336/200 |
| 7,405,698 B2 | 7/2008 | de Rochemont |
| 7,564,887 B2 | 7/2009 | Wang et al. |
| 7,573,119 B2 * | 8/2009 | Kobayashi et al. ........... 257/531 |
| 7,763,917 B2 | 7/2010 | deRochemont |
| 2001/0023779 A1 | 9/2001 | Sugaya et al. |
| 2001/0027119 A1 | 10/2001 | Furutani et al. |
| 2001/0036702 A1 | 11/2001 | Kossives et al. |
| 2001/0048969 A1 | 12/2001 | Constantino et al. |
| 2002/0039667 A1 | 4/2002 | Takaya et al. |
| 2002/0047768 A1 | 4/2002 | Duffy |
| 2002/0070983 A1 | 6/2002 | Kozub et al. |
| 2002/0092472 A1 | 7/2002 | Hayashi et al. |
| 2002/0110004 A1 | 8/2002 | Parks |
| 2002/0190818 A1 | 12/2002 | Endou et al. |
| 2003/0002045 A1 | 1/2003 | Nemat-Nasser et al. |
| 2003/0034124 A1 | 2/2003 | Sugaya et al. |
| 2003/0073565 A1 | 4/2003 | Ellis et al. |
| 2003/0080325 A1 | 5/2003 | Uchiyama et al. |
| 2003/0107455 A1 | 6/2003 | Imanaka et al. |
| 2003/0111714 A1 | 6/2003 | Bates et al. |
| 2003/0122647 A1 | 7/2003 | Ou |
| 2003/0148024 A1 | 8/2003 | Kodas et al. |
| 2003/0161959 A1 | 8/2003 | Kodas et al. |
| 2003/0170436 A1 | 9/2003 | Sumi et al. |
| 2003/0221621 A1 | 12/2003 | Pokharna et al. |
| 2004/0000964 A1 | 1/2004 | Killen et al. |
| 2004/0000966 A1 | 1/2004 | Killen et al. |
| 2004/0000970 A1 | 1/2004 | Killen et al. |
| 2004/0000972 A1 | 1/2004 | Killen et al. |
| 2004/0000975 A1 | 1/2004 | Killen et al. |
| 2004/0000976 A1 | 1/2004 | Killen et al. |
| 2004/0001024 A1 | 1/2004 | Killen et al. |
| 2004/0001026 A1 | 1/2004 | Killen et al. |
| 2004/0001027 A1 | 1/2004 | Killen et al. |
| 2004/0001028 A1 | 1/2004 | Killen et al. |
| 2004/0012081 A1 | 1/2004 | Kwon |
| 2004/0033654 A1 | 2/2004 | Yamagata |
| 2004/0070915 A1 | 4/2004 | Nagai et al. |
| 2004/0084080 A1 | 5/2004 | Sager et al. |
| 2004/0092236 A1 | 5/2004 | Irie et al. |
| 2004/0113738 A1 | 6/2004 | Ahn et al. |
| 2004/0118448 A1 | 6/2004 | Scher et al. |
| 2004/0189528 A1 | 9/2004 | Killen et al. |
| 2005/0036269 A1 | 2/2005 | Ma et al. |
| 2005/0051870 A1 | 3/2005 | Yamazaki et al. |
| 2006/0086994 A1 | 4/2006 | Viefers et al. |
| 2006/0092079 A1 | 5/2006 | deRochemont |
| 2006/0125681 A1 | 6/2006 | Smith et al. |
| 2006/0134491 A1 | 6/2006 | Hilchenko et al. |
| 2006/0145309 A1 * | 7/2006 | Nakano et al. ........... 257/664 |
| 2007/0001658 A1 | 1/2007 | Nguyen et al. |
| 2007/0003781 A1 | 1/2007 | de Rochemont ........... 428/615 |
| 2007/0137257 A1 | 6/2007 | Desantolo et al. |
| 2007/0139976 A1 * | 6/2007 | deRochemont .......... 363/17 |
| 2007/0166453 A1 | 7/2007 | Van Duren et al. |
| 2007/0170535 A1 | 7/2007 | deRochemont |
| 2007/0259768 A1 | 11/2007 | Kear et al. |
| 2008/0035974 A1 * | 2/2008 | Lin ............... 257/300 |

(56) References Cited

U.S. PATENT DOCUMENTS

| | | |
|---|---|---|
| 2008/0036680 A1* | 2/2008 | Ito et al. ............... 343/873 |
| 2008/0136395 A1 | 6/2008 | Bennett |
| 2009/0004370 A1 | 1/2009 | Zurcher et al. |
| 2009/0011922 A1 | 1/2009 | deRochemont |
| 2009/0015314 A1 | 1/2009 | Kirchmeier et al. |
| 2009/0321784 A1 | 12/2009 | Anderson et al. |
| 2010/0085778 A1 | 4/2010 | Saito et al. |
| 2011/0021007 A1 | 1/2011 | deRochemont |
| 2011/0049394 A1 | 3/2011 | deRochemont |
| 2011/0065224 A1 | 3/2011 | Bollman et al. |
| 2011/0248900 A1 | 10/2011 | deRochemont |
| 2011/0298551 A1* | 12/2011 | Yen et al. ............. 331/117 FE |

OTHER PUBLICATIONS

Chappell, W. et al. Composite Metamaterial Systems for Two-Dimensional Periodic Structures. © 2002 IEEE pp. 384-387.

Cheng, Y.L. et al. Preparation and Characterization of (Ba.Sr)TiO3 thin films using interdigital electrodes. Microelectronic Engineering vol. 66 (2003) 872-879.

Diaz, R. et al. Magnetic Loading of Artificial Magnetic Conductors for Bandwidth Enhancement. © 2003 IEEE pp. 431-434.

Hansen, R.C. Effects of a High-Impedance Screen on a Dipole Antenna. IEEE Antennas and Wireless Propagation Letters vol. 1 2002 pp. 46-49.

Joshi, P.C. et al. Processing and Characterization of Pure and Doped Ba0.6Sr0.4TiO3 thin films for tunable microwave applications. Mat. Res. Soc. Symp. Proc. vol. 656E (2001) DD4.9.1-DD4.9.6.

Kern, D.J. et al. Active Negative Impedance Loaded EBG Structures for the Realization of Ultra-Wideband Artificial Magnetic Conductors. © 2003 IEEE pp. 427-430.

Kern, D.J. et al. The Synthesis of Metamaterial Ferrites for RF Applications Using Electromagnetic Bandgap Structures. © 2003 IEEE pp. 497-500.

Kern, D.J. et al. Ultra-thin Electromagnetic Bandgap Absorbers Synthesized via Genetic Algorithms. © 2003 IEEE pp. 1119-1122.

Kretly, L.C. et al. The Influence of the Height Variation on the Frequency Bandgap in an AMC Artificial Magnetic Conductor for Wireless Applications: an EM Experimental Design Approach. Proceedings SBMO/IEEE MTT-S IMOC 2003 pp. 219-223.

Lee, Y. et al. Investigation of Electromagnetic Bandgap (EBG) Structures for Antenna Pattern Control. © 2003 IEEE, pp. 1115-1118.

McKinzie III, W.E. et al. Mitigation of Multipath Through the Use of an Artificial Magnetic Conductor for Precision CPS Surveying Antennas. © 2002 IEEE pp. 640-643.

McKinzie, W. et al. A Multi-Band Artificial Magnetic Conductor Comprised of Multiple FSS Layers. © 2003 IEEE pp. 423-426.

Monorchio, A. et al. Synthesis of Artificial Magnetic Conductors by Using Multilayered Frequency Selective Surfaces. IEEE Antennas and Wireless Propagation Letters vol. 1 2002 pp. 196-199.

Mosallaei, H. et al. Periodic Bandgap and Effective Dielectric Materials in Electromagnetics: Characterization and Applications in Nanocavities and Waveguides. IEEE Transactions on Antennas and Propagation 51(3). Mar. 2003. pp. 549-563.

Pontes, F.M. et al. Study of the dielectric and ferroelectric properties of chemically processed BaxSr1-xTiO3 thin films. Thin Solid Films, vol. 386, No. 1 (2001) 91-98.

Rogers, S. et al. AMCs Comprised of Interdigital Capacitor FSS Layers Enable Lower Cost Applications. © 2003 IEEE pp. 411-414.

Rogers, S. et al. An AMC-Based 802.11a/b Antenna for Laptop Computers. © 2003 IEEE pp. 10-13.

Sievenpiper, D.F. et al. Two-Dimensional Beam Steering Using an Electrically Tunable Impedance Surface. IEEE Transactions on Antennas and Propagation 51(10). Oct. 2003. pp. 2713-2722.

Sun, J. et al. Efficiency of Various Photonic Bandgap (PBG) Structures. $3^{rd}$ Int'l. Conf. on Microwave and Millimeter Wave Technology Proceedings 2002. pp. 1055-1058.

Tsunemine, Y. et al. Pt/BaxSr(1-x)TiO3/Pt Capacitor Technology for 0.15 micron Embedded Dynamic Random Access Memory. Jap. J. Appl. Phys. vol. 43 No. 5A (2004) 2457-2461.

Vest, R.W. Metallo-organic decomposition (MOD) processing of ferroelectric and electro-optic films: A review. Ferroelectrics, 102:1, 53-68.

Viviani, M. et al. Positive Temperature Coefficient of Electrical Resistivity below 150k of Barium Strontium Titanate. J. Amer. Ceram. Soc. vol. 87 (2004) 756-758.

Weily, A.R. et al. Antennas Based on 2-D and 3-D Electromagnetic Bandgap Materials. © 2003 IEEE pp. 847-850.

Yang, H-Y. D. et al. Surface Waves of Printed Antennas on Planar Artificial Periodic Dielectric Structures. IEEE Transactions on Antennas and Propagation 49(3). Mar. 2001. pp. 444-450.

Zhang, Y. et al. Planar Artificial Magnetic Conductors and Patch Antennas. IEEE Transactions on Antennas and Propagation 51(10). Oct. 2003, 2704-2712.

Ziroff, A. et al. A Novel Approach for LTCC Packaging Using a PBG Structure for Shielding and Package Mode Suppression. $33^{rd}$ European Microwave Conference—Munich 2003 pp. 419-422.

International Search Report and Written Opinion dated Mar. 29, 2012 for PCT/US11/61311.

Andrenko, A.S. et al. EM Analysis of PBG Substrate Microstrip Circuits for Integrated Transmitter Front End. MMET Sep. 2000 Proceedings pp. 295-297.

Bardi, I. et al. Plane Wave Scattering From Frequency-Selective Surfaces by the Finite-Element Method. IEEE Transactions on Magnetics 38(2) Mar. 2002. pp. 641-644.

Chappell, W. et al. Composite Metamaterial Systems for Two Dimensional Periodic Structures. IEEE Antennas and Propagation Society International Symposium (Jun. 2002) pp. 384-387.

Cheng, Y.L. et al. Preparation and Characterization of (Ba.Sr)TiO3 thin films using interdigital electrodes. Microelectronic Engineering vol. 66 (Jun. 2003) 872-879.

Clavijo, S. et al. Design Methodology for Sievenpiper High-Impedance Surfaces: An Artificial Magnetic Conductor for Positive Gain Electrically Small Antennas. IEEE Transactions on Antennas and Propagation 51(10). Oct. 2003. pp. 2678-2690.

Diaz, R. et al. Magnetic Loading of Artificial Magnetic Conductors for Bandwidth Enhancement, IEEE Antennas and Propagation Society International Symposium (Jun. 2003) pp. 431-434.

Hansen, R.C. Effects of a High-Impedance Screen on a Dipole Antenna. IEEE Antennas and Wireless Propagation Letters (vol. 1, Issue 1) Jan. 2002, pp. 46-49.

Joshi, P.C. et al. Processing and Characterization of Pure and Doped Ba0.6Sr0.4TiO3 thin films for tunable microwave applications. Mat. Res. Soc. Symp. Proc. vol. 656E (Jan. 2001) DD4.9.1-DD4.9.6.

Kern, D.J. et al. Active Negative Impedance Loaded EBG Structures for the Realization of Ultra-Wideband Artificial Magnetic Conductors. IEEE Antennas and Propagation Society International Symposium (Jun. 2003), pp. 427-430.

Kern, D.J. et al. The Synthesis of Metamaterial Ferrites for RF Applications Using Electromagnetic Bandgap Structures. IEEE Antennas and Propagation Society International Symposium (Jun. 2003), pp. 497-500.

Kern, D.J. et al. Ultra-thin Electromagnetic Bandgap Absorbers Synthesized via Genetic Algorithms. IEEE Antennas and Propagation Society International Symposium (Jun. 2003) pp. 1119-1122.

Khun, R. et al., Characterization of Novel Mono- and Bifacially Active Semi-Transparent Crystalline Silicon Solar Cells, IEEE Transactions on Electron Devices, 46(10), Oct. 1999, p. 2013-2017.

Kretly, L.C. et al. The Influence of the Height Variation on the Frequency Bandgap in an AMC Artificial Magnetic Conductor for Wireless Applications: an EM Experimental Design Approach. Proceedings SBMO/IEEE MTT-S IMOC (Sep. 2003) pp. 219-223.

Lee, Y. et al, Investigation of Electromagnetic Bandgap (EBG) Structures for Antenna Pattern Control. IEEE Antennas and Propagation Society International Symposium (Jun. 2003), pp. 1115-1118.

McKinzie III, W.E. et al. Mitigation of Multipath Through the Use of an Artificial Magnetic Conductor for Precision CPS Surveying Antennas. IEEE Antennas and Propagation Society International Symposium (Jun. 2002) pp. 640-643.

McKinzie, W. et al. A Multi-Band Artificial Magnetic Conductor Comprised of Multiple FSS Layers. IEEE Antennas and Propagation Society International Symposium (Jun. 2003) pp. 423-426.

(56) References Cited

OTHER PUBLICATIONS

Monorchio, A. et al, Synthesis of Artificial Magnetic Conductors by Using Multilayered Frequency Selective Surfaces. IEEE Antennas and Wireless Propagation Letters vol. 1 (Jan. 2002) pp. 190-199.

Mosallaei, H. et al. Periodic Bandgap and Effective Dielectric Materials in Electromagnetics: Characterization and Applications in Nanocavities and Waveguides. IEEE Transactions on Antennas and Propagation 51(3), Mar. 2003. pp. 549-563.

Pontes, F.M. et al. Study of the dielectric and ferroelectric properties of chemically processed BaxSr1–xTiO3 thin films. Thin Solid Films, vol. 386, Issue 1, May 1, 2001, pp. 91-98.

Rogers, S. et al. AMCs Comprised of Interdigital Capacitor FSS Layers Enable Lower Cost Applications. IEEE Antennas and Propagation Society International Symposium (Jun. 2003) pp. 411-414.

Rogers, S. et al. An AMC-Based 802.11a/b Antenna for Laptop Computers. IEEE Antennas and Propagation Society International Symposium (Jun. 2003) pp. 10-13.

Sievenpiper, D.F. et al. Two-Dimensional Beam Steering Using an Electrically Tunable Impedance Surface. IEEE Transactions on Antennas and Propagation 51(10), Oct. 2003. pp. 2713-2722.

Sun, J. et al, Efficiency of Various Photonic Bandgap (PBG) Structures. $3^{rd}$ Int'l, Conf. on Microwave and Millimeter Wave Technology Proceedings (Aug. 2002) pp. 1055-1058.

Tsunemine, Y. et al. Pt/BaxSr(1–x)TiO3/Pt Capacitor Technology for 0.15 micron Embedded Dynamic Random Access Memory. Jap. J. Appl. Phys. vol. 43 No. 5A (May 2004) 2457-2461.

Vest, R.W. Metallo-organic decomposition (MOD) processing of ferroelectric and electro-optic films: A review. Ferroelectrics 102:1 (Jan. 1990) 53-68.

Viviani, M. et al. Positive Temperature Coefficient of Electrical Resistivity below 150k of Barium Strontium Titanate. J. Amer. Ceram. Soc. vol. 87 (Apr. 2004) 756-758.

Weily, A.R. et al. Antennas Based on 2-D and 3-D Electromagnetic Bandgap Materials. IEEE Antennas and Propagation Society International Symposium (Jun. 2003) 847-850.

Yang, H-Y. D. et al. Surface Waves of Printed Antennas on Planar Artificial Periodic Dielectric Structures. IEEE Transactions on Antennas and Propagation 49(3). pp. 444-450.

Zhang, Y. et al. Planar Artificial Magnetic Conductors and Patch Antennas. IEEE Transactions on Antennas and Propagation 51(10), Oct. 2003, 2704-2712.

Ziroff, A. et al. A Novel Approach for LTCC Packaging Using a PBG Structure for Shielding and Package Mode Suppression, $33^{rd}$ European Microwave Conference—Munich (Oct.) 2003 pp. 419-422.

\* cited by examiner

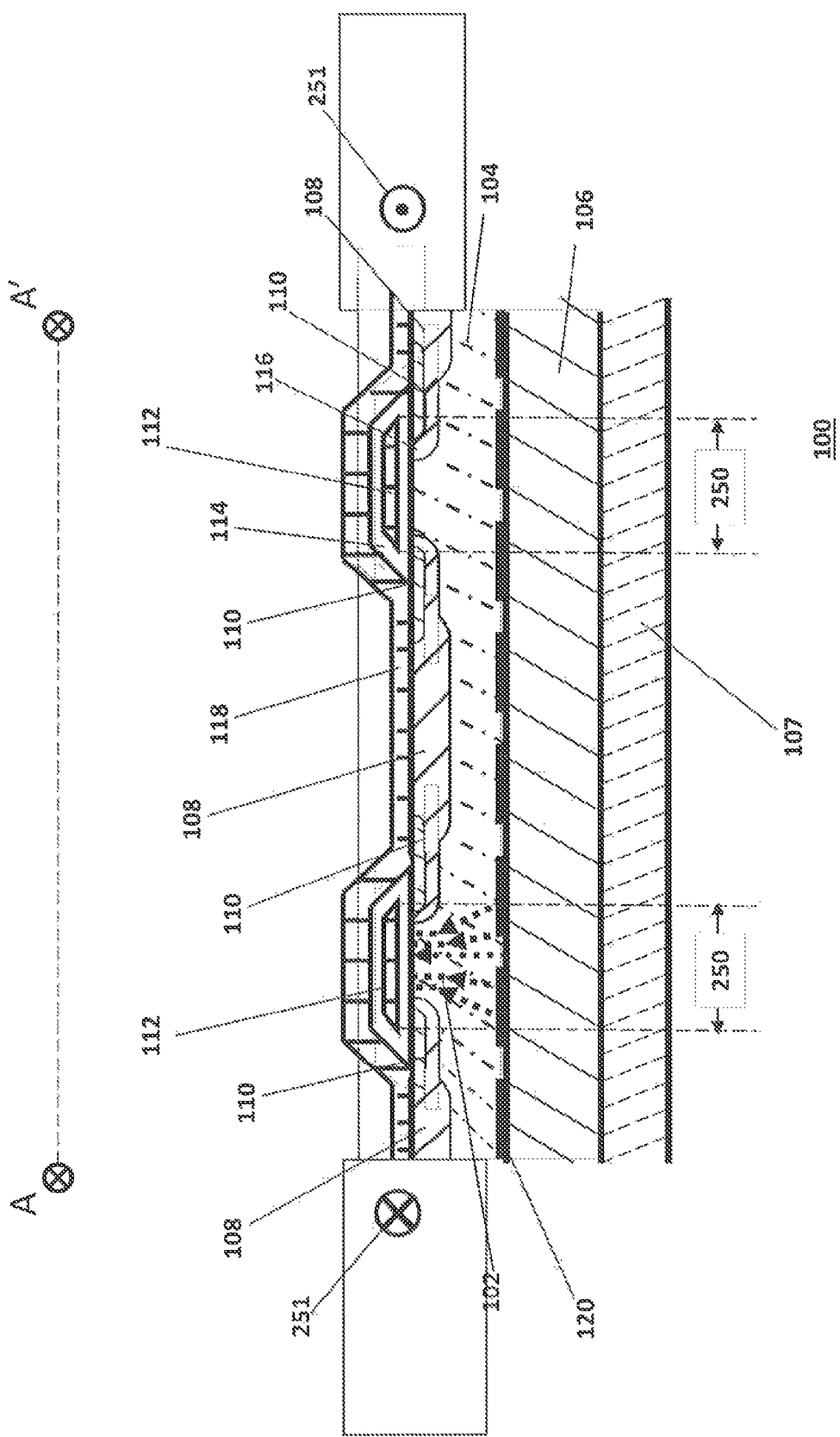
FIG. 5A (Amended)

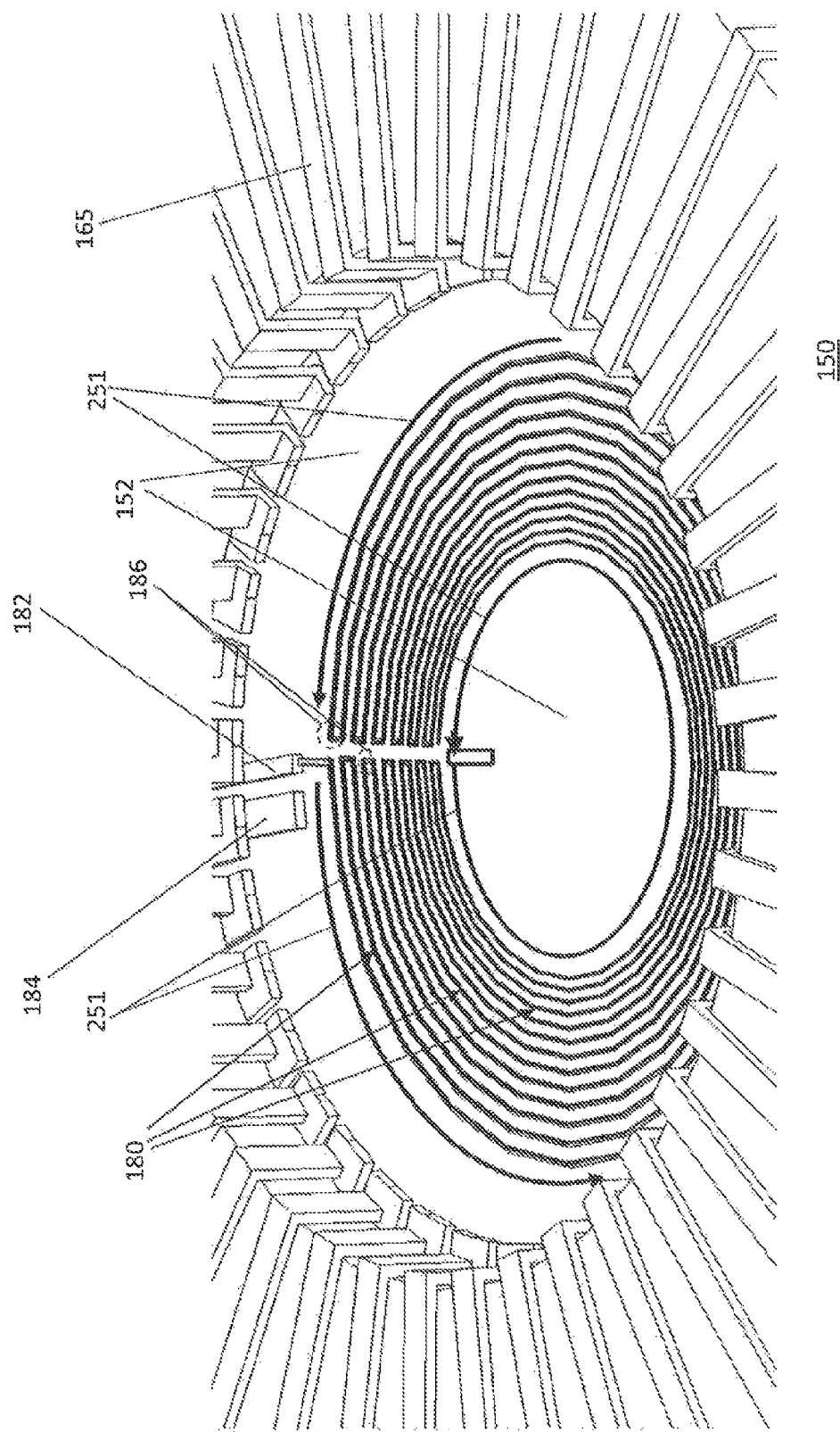
FIG. 5C (Amended)

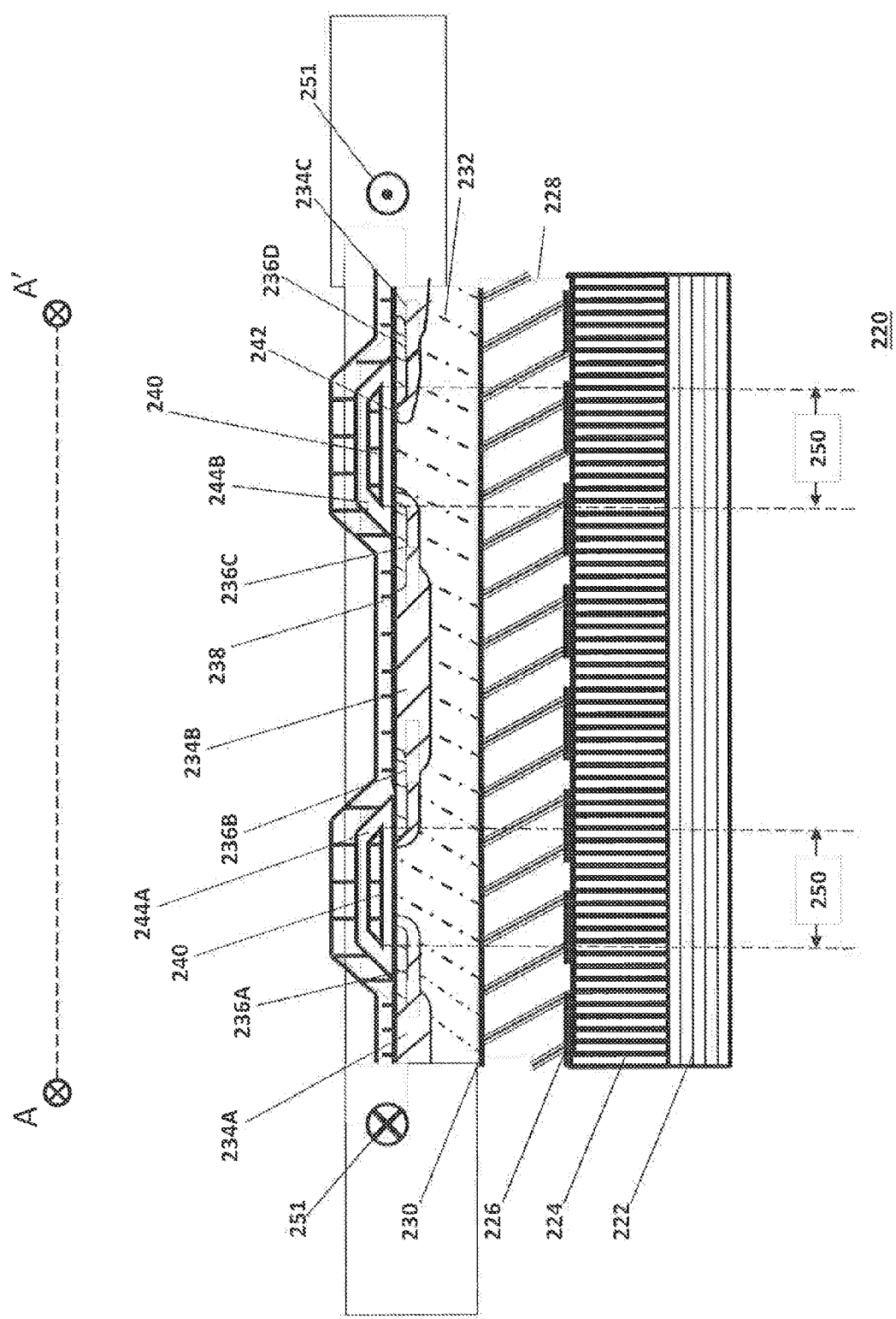
FIG. 5E (Amended)

PERSPECTIVE "A"

PERSPECTIVE "B"

SEMICONDUCTOR CARRIER WITH VERTICAL POWER FET MODULE

CROSS REFERENCE TO RELATED APPLICATIONS

This application claims priority from U.S. Provisional Patent Applications numbered 61/358,040, filed Jun. 24, 2010 and 61/359,091, filed Jun. 28, 2010 and incorporated herein by reference in their entirety.

FIELD OF THE INVENTION

The present invention generally relates to DC/DC power management devices configured as a fully integrated system on a semiconductor layer as a monolithic structure that modulates the power drawn through the layer with a vertical FET switch and a diode embedded in the semiconductor layer surface, and more specifically to the integration of such a device in a semiconductor carrier that has other circuitry satisfying critical performance tolerances integrated within it and is used to supply power to and maintain electrical communication between one or more semiconductor integrated circuits attached to the semiconductor carrier surface.

BACKGROUND OF THE INVENTION

DC/DC power management systems generally regulate static or switched-mode DC power levels supplied at a particular voltage/current. Static power management systems condition the output voltage and current to levels that are appropriate for a particular circuit. When operated in a switched-mode, these power management systems are also used to cycle power within a given circuit at time periods that cause the circuit to "turn off" during time intervals when its functions are not absolutely needed by the larger system it serves. Power cycling is particularly important in mobile systems to extend battery life, and when refreshing and clocking data between random access memory and microprocessor systems, particularly in multi-core microprocessor architectures. The concepts presented herein are not limited to DC/DC power systems, and can be similarly applied to AC/DC inverter and AC/AC transformer circuitry with rudimentary understanding of those skilled in the art of power management.

Multi-processor core systems have particular relevance to the present invention. Localized high-speed computing systems co-locate microprocessor, memory, and micro-controller subsystem functions within a processing cell that is wired in parallel with other processor cells. Until recently, higher computing speeds are achieved by distributing instructions across all the cells to allow each cell to work simultaneously on an instruction packet. Fundamental limitations relating to the stability of the clock circuitry that times data transfers within and between each of the subsystems, and the speed and power levels at which external power management circuitry can supply power to the computing cell is now causing the microprocessor to be underutilized. These fundamental limitations now cause the microprocessor of a single cell to operate at 25%-30% of its utilization capacity. Utilization capacities are further reduced when microprocessors are arrayed in parallel. For instance, a 16 core microprocessor array will function slower than a 4 core microprocessor array. The under-utilization of localized microprocessor arrays has motivated the development of cloud computing architectures that distribute computational functions across a computer network, which open undesirable risks to data security in many computational applications. Therefore, it is desirable to provide switched-mode power levels at higher speeds, as well as stable clock circuitry to a single processor or a multi-core processor system.

Thermal management considerations are a principal impediment to achieving these objectives. Power management systems and processor cores generate heat that compromises performance when not adequately managed. The significant heat generated in power management circuitry having less than optimal efficiencies cause it to be physically isolated, typically on another board, from memory, microprocessor, controller circuitry, which generate large amounts of heat in their own right. The physical separation contributes to the less than optimal delivery of power at the speeds necessary to resolve these problems. Methods that produce higher efficiency power management modules which generate lower heat levels permit higher power levels to be supplied by placing the power management device in closer proximity to memory and microprocessor core circuitry. Co-location of high efficiency switched-mode power management devices with one or more processor cells also reduce overall system power losses through much shorter interconnect circuitry. Methods and apparatus that improve supplied power to a processor core are therefore desirable to the enhanced utilization of microprocessor arrays and the improved operational efficiency of high-speed computing systems.

Heat generated by the processor circuitry and any co-located power management device alters the timing of conventional clock circuitry. This causes a need for additional control circuitry to maintain stable clock functionality. Therefore, the development of clock circuitry that remains stable with varying temperature, and the introduction of additional means to reduce the power consumed by semiconductor die in electrical communication with co-located power management systems are also desirable.

1. DESCRIPTION OF THE PRIOR ART

Hopper et al., U.S. Pat. No. 7,652,348 B1, "APPARATUS & METHOD FOR WAFER LEVEL FABRICATION OF HIGH VALUE INDUCTORS ON SEMICONDUCTOR IC's", issued Jan. 1, 26, 2010, teach the assembly of inductor coils on semiconductor wafers containing active devices buried beneath the wafer surface using high permeability magnetic core material prepared from powder pastes.

Bose et al., U.S. Ser. No. 12/023,536, "METHOD AND SYSTEMS OF MULTI-CORE MICROPROCESSOR POWER MANAGEMENT AND CONTROL VIA PER-CHIPLET PROGRAMMABLE POWER MODES", filed Jan. 31, 2008, published Aug. 6, 2009, as U.S. Pub. No. 2009/0199020 A1, instructs a system that manages power in a microprocessor core and an associated memory cache.

Ewing et al., U.S. Ser. No. 12/344,419, "POWER DISTRIBUTION, MANAGEMENT, AND MONITORING SYSTEMS AND METHODS", filed Dec. 26, 2008, and published Sep. 17, 2009 as U.S. Pub. No. 2009/0234512 discloses the discrete assembly of a power management system that contains toroidal inductor coils.

Hughes et al., U.S. Ser. No. 12/356,624, "PROCESSOR POWER MANAGEMENT AND METHOD", filed Jan. 21, 2009, and published Jul. 22, 2010 as U.S. Pub. No. 2010/0185820 A1, induces a sequence of sleep modes among multiple processors cores to optimize power utilization in under-utilized multi-core processor configurations (Hughes et al. '624).

Finkelstein et al., U.S. Ser. No. 12/263,421, "POWER MANAGEMENT FOR MULTIPLE PROCESSOR CORES", filed Oct. 31, 2008, and published May 6, 2010, as U.S. Pub. No. 2010/0115304 A1, instructs techniques to manage power consumption locally in processor and the distribution of power among different power planes of a processor core based on energy-based considerations.

Yung-Hsiang, U.S. Ser. No. 11/713,889, "POWER MANAGEMENT IN COMPUTER OPERATING SYSTEMS", filed Mar. 5, 2007, and published Oct. 18, 2007 as U.S. Pub. No. 2007/0245163 A1, instructs the use of selection policies to manage power distribution to components in a computer system.

Brittain et al., U.S. Ser. No. 11/463,743, "SYSTEMS AND METHODS FOR MEMORY POWER MANANGEMENT", filed Aug. 10, 2006, and published Feb. 14, 2008 as 2008/0040563 A1, instructs systems for determining specific power consumption and usage levels in computer memory systems.

Borkar et al. U.S. Pat. No. 7,568,112, "POWER DELIVERY AND POWER MANAGEMENT OF MANY CORE PROCESSORS", filed Sep. 9, 2005, uses multiple voltage regulators that may be integrated within the die or packaged with the die to manage power to a multi-microprocessor core system.

Ou, U.S. Ser. No. 10/236,700, "INDUCTOR FORMED ON A SILICON SUBSTRATE AND METHOD OF MANUFACTURING THE SAME", filed Sep. 5, 2002 and published Jul. 3, 2003 as U.S. Pub. No. 2003/0122647 teaches the integration of inductor coils using methods that are compatible with CMOS semiconductor processes.

Evans et al., U.S. Pat. No. 5,543,773. "TRANSFORMERS AND COUPLED INDUCTORS WITH OPTIMUM INTERLEAVING", issued Aug. 6, 1996, discloses the discrete assembly of toroidal inductor and transformer coils on a printed circuit board with optimal interleaving to minimize flux leakage and proximity losses as shown in FIG. 2.

2. DEFINITION OF TERMS

The term "active component" is herein understood to refer to its conventional definition as an element of an electrical circuit that that does require electrical power to operate and is capable of producing power gain.

The term "amorphous material" is herein understood to mean a material that does not comprise a periodic lattice of atomic elements, or lacks mid-range (over distances of 10's of nanometers) to long-range crystalline order (over distances of 100's of nanometers).

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "chip carrier" is herein understood to refer to an interconnect structure built into a semiconductor substrate that contains wiring elements and active components that route electrical signals between one or more integrated circuits mounted on chip carrier's surface and a larger electrical system that they may be connected to.

The term "DDMOSFET" herein references its conventional meaning as a double-diffused dopant profile in conjunction with a field-effect transistor that uses a metal-oxide-semiconductor interface to modulate currents.

The terms "discrete assembly" or "discretely assembled" is herein understood to mean the serial construction of an embodiment through the assembly of a plurality of pre-fabricated components that individually comprise a discrete element of the final assembly.

The term "emf" is herein understood to mean its conventional definition as being an electromotive force.

The term "EMI" is herein understood to mean its conventional definition as electromagnetic interference.

The term "IGBT" herein references its conventional meaning as an insulated gate bipolar transistor.

The term "integrated circuit" is herein understood to mean a semiconductor chip into which a large, very large, or ultra-large number of transistor elements have been embedded.

The term "LCD" is herein understood to mean a method that uses liquid precursor solutions to fabricate materials of arbitrary compositional or chemical complexity as an amorphous laminate or free-standing body or as a crystalline laminate or free-standing body that has atomic-scale chemical uniformity and a microstructure that is controllable down to nanoscale dimensions.

The term "liquid precursor solution" is herein understood to mean a solution of hydrocarbon molecules that also contains soluble metalorganic compounds that may or may not be organic acid salts of the hydrocarbon molecules into which they are dissolved.

The term "microstructure" is herein understood to define the elemental composition and physical size of crystalline grains forming a material substance.

The term "MISFET" is herein understood to mean its conventional definition by referencing a metal-insulator-semiconductor field effect transistor.

The term "mismatched materials" is herein understood to define two materials that have dissimilar crystalline lattice structure, or lattice constants that differ by 5% or more, and/or thermal coefficients of expansion that differ by 10% or more.

The term "MOSFET" is herein understood to mean its conventional definition by referencing a metal-oxide-silicon field effect transistor.

The term "nanoscale" is herein understood to define physical dimensions measured in lengths ranging from 1 nanometer (nm) to 100's of nanometers (nm).

The term "passive component" is herein understood to refer to its conventional definition as an element of an electrical circuit that that does not require electrical power to operate and is not capable of producing power gain.

The term "power FET" is herein understood to refer to the generally accepted definition for a large signal vertically configured MOSFET and covers multi-channel (MUCHFET), V-groove MOSFET, truncated V-groove MOSFET, double-diffusion DMOSFET, modulation-doped transistors (MODFET), heterojunction transistors (HETFET), and insulated-gate bipolar transistors (IGBT).

The term "standard operating temperatures" is herein understood to mean the range of temperatures between −40° C. and +125° C.

The term "surface FET" is herein understood to understood by its conventional definition as a field effect transistor that uses electrodes applied to, and electronic dopant profiles patterned on the surface of and within a semiconductor layer to modulate current flows across the surface of the semiconductor layer.

The terms "tight tolerance" or "critical tolerance" are herein understood to mean a performance value, such as a capacitance, inductance, or resistance, that varies less than ±1% over standard operating temperatures.

In view of the above discussion, it would be beneficial to improve the operational efficiency of semiconductor die, including the utilization of processor cores, by shrinking their size, power consumption, using methods that enable reduced transistor counts, stable clock circuitry, and the delivery of higher power levels using high-frequency switched mode power. The present invention instructs the monolithic integration of low-loss high-power, high-speed switched-mode power management on a silicon carrier to improve the operational efficiency of semiconductor die, including processor cells, co-located on the silicon carrier.

SUMMARY OF THE INVENTION

One embodiment of the present invention provides a monolithic power switch, comprising: a semiconductor layer; a three dimensional FET formed in the semiconductor layer to modulate currents through the semiconductor layer; and a toroidal inductor with a ceramic magnetic core formed on the semiconductor layer around the FET and having a first winding connected to the FET.

The switch may further comprise a semiconductor carrier having the switch formed therein. The semiconductor carrier may include passive ceramic components formed thereon and electrically connected to the switch. The switch may further comprising: a diode formed in the semiconductor layer peripherally to the toroidal inductor and connected to rectify current from the inductor; and a capacitor having a ceramic dielectric formed on the semiconductor layer, and connected to the diode.

The switch may further comprise a timing oscillator formed on the carrier and comprising an oscillator coil formed on an amorphous silica layer, wherein the oscillator coil holds its inductance value to within 1% over a standard operating temperature range. The timing oscillator may include switching elements formed in the carrier for controlling oscillation frequency of the oscillator coil.

The FET may be a double-diffused MOSFET or an insulated gate bipolar transistor. The FET may include a gate electrode having a gate width to gate length ratio that is equal to or exceeds 100, or alternatively $10^6$. The FET may includes an elongated gate electrode that forms a resonant transmission line. The elongated gate electrode may meander over an area of the substrate located within a central opening of the toroidal inductor. The elongated gate electrode may be insulated with amorphous silica. The second electrode may be located over the elongated gate electrode and insulated therefrom.

Another embodiment of the present invention provides a semiconductor power switch, comprising: a planar first electrode; a first layer doped semiconductor material disposed on the first electrode that forms ohmic contact with the planar first electrode; a second layer of doped semiconductor material disposed on the first layer that is electronically patterned to form a double-diffused MOSFET; a second electrode disposed upon the second layer; an elongated gate electrode located to modulate current flow from the planar first electrode through the second layer to the second electrode and having a ratio of gate width to gate length that this greater than or equal to 100; wherein the elongated gate electrode forms a serpentine pattern over the second layer and is insulated from the second region and the second electrode; and wherein the elongated gate structure forms a transmission line that is resonant at a predetermined power switching frequency.

The switch may further comprise a circuit module having the switch of claim 1 formed therein. The elongated gate electrode may meander adjacent a contiguous surface area of the second layer to maximize gate width over that contiguous surface area. The first layer may be formed as a region of the substrate and the contiguous surface area is surrounded by a toroidal inductor having a ceramic core formed on the substrate. The elongated gate electrode may include adjacent parallel gate portions.

The double-diffused MOSFET may include a pair of parallel elongated channel regions located beneath the elongated gate electrode. The elongated gate electrode may be meandered and has a gate width to gate length ratio that is greater than or equal to $10^6$.

The first semiconductor layer may be doped to form an insulated gate bipolar transistor when making electrical contact with the second semiconductor layer.

Yet another embodiment of the present invention provides a monolithic power management module, comprising: a semiconductor carrier; a three dimensional FET formed in the semiconductor carrier to modulate currents through the semiconductor carrier; and a toroidal inductor with a ceramic magnetic core formed on the semiconductor carrier around the FET and having a first winding connected to the FET. The module may further comprise a plurality of active components and passive ceramic components formed on or in the semiconductor carrier.

BRIEF DESCRIPTION OF THE DRAWINGS

The present invention is illustratively shown and described in reference to the accompanying drawings, in which:

FIG. 5A is a cross-sectional view of a DDMOS vertical power FET.

FIG. 5C is a top perspective view of the elongated resonant gate on the surface of the electronically patterned semiconductor layer.

FIG. 5E is a cross-sectional view of an IGBT vertical power FET.

DETAILED DESCRIPTION OF THE INVENTION

The present invention is introduced using examples and particular embodiments for descriptive purposes. Although a variety of examples are presented to show how various configurations can be employed to achieve the desired improvements, these particular embodiments are only illustrative and not intended in any way to restrict the inventions presented.

This application is filed jointly with de Rochemont U.S. provisional application No. 61/375,894, "FULLY INTEGRATED HIGH POWER DENSITY SILICON CARRIER", filed Aug. 23, 2010 (de Rochemont '894), which is incorporated herein by reference. The current application focuses primarily on means to fully integrate a high efficiency, power management system on a silicon carrier as a monolithic structure that modulates high current levels using a resonant gate structure enabled by a three-dimensional gate structure with serpentine windings. The counterpart application, (de Rochemont '894), addresses means to switch current at high speed or over any desirable range of frequencies using a resonant transistor gate that has its resonance tuned through additional passive components inserted into the gate. The application is also filed jointly with de Rochemont U.S. provisional application No. 61/409,846, "QUANTUM DOT FIELD EFFECT TRANSISTOR IN A FULLY INTEGRATED SILICON CARRIER AND METHOD OF MANUFACTURE THEREOF", filed Nov. 3, 2010 (de Rochemont '846), which is incorporated herein by reference.

The current application incorporates by reference all matter contained in de Rochemont, U.S. Ser. No. 11/479,159, filed Jun. 30, 2006, entitled "ELECTRICAL COMPONENT AND METHOD OF MANUFACTURE" (the '159 application), de Rochemont, U.S. Ser. No. 11/620,042 filed Jan. 6, 2007 entitled "POWER MANAGEMENT MODULES" (the '042 application, de Rochemont and Kovacs, U.S. Ser. No. 12/843,112 filed Jul. 26, 2010, "LIQUID CHEMICAL DEPOSITION PROCESS APPARATUS AND EMBODIMENTS", (the '112 application), and de Rochemont U.S. Ser. No. 13/152,222, entitled "MONOLITHIC DC/DC POWER MANAGEMENT MODULE WITH SURFACE FET", filed Jun. 2, 2011 (the '222 application).

Figure 1:
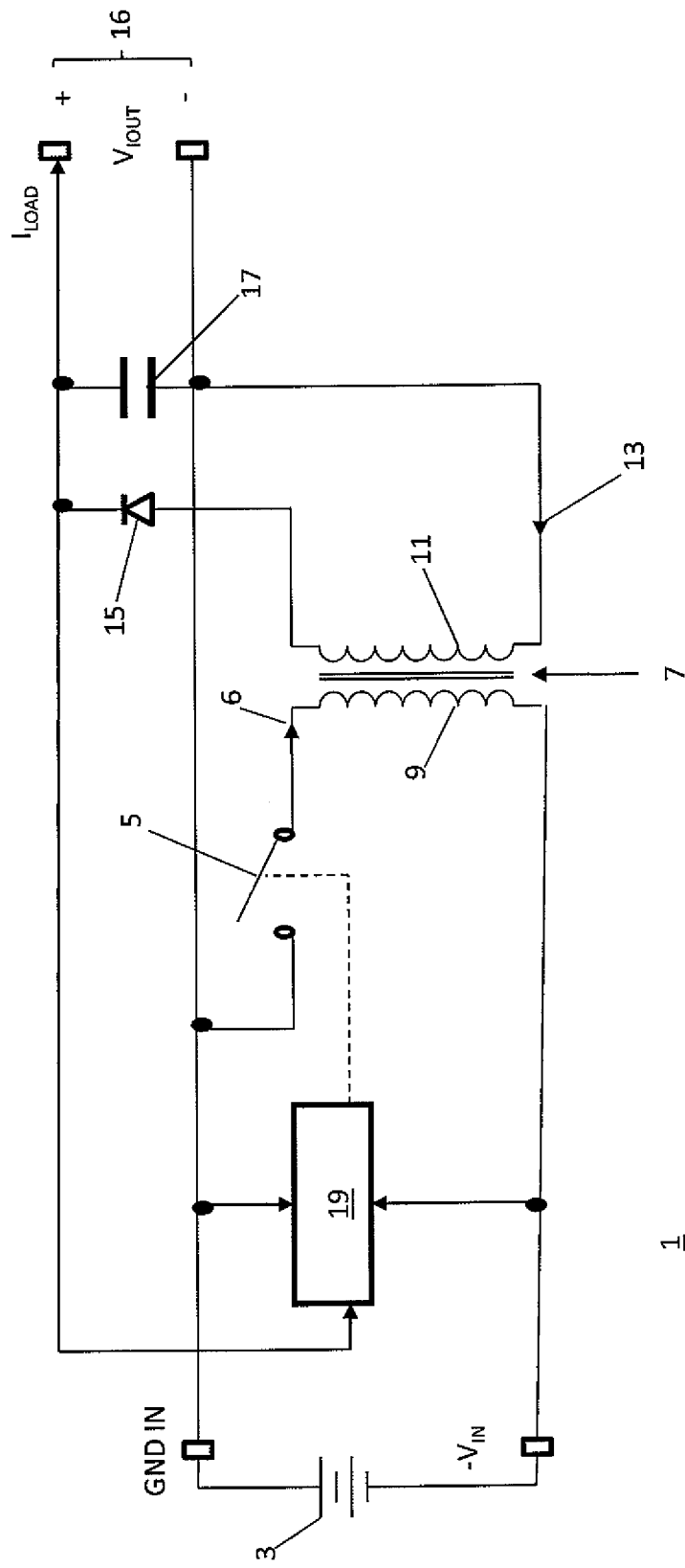
FIG. 1 is a representative circuit schematic for a DC-DC converter in fly-back configuration.

Reference is now made to FIGS. 1-4 to help illustrate certain aspects of this invention. FIG. 1 provides a circuit schematic of a DC/DC power management system having fly-back configuration. A power management system 1 is generally, but not necessarily, comprised of a DC power source 3 that feeds at least one power switch 5, which modulates the primary current 6 drawn from electrical ground to at least one transformer 7 comprised of a primary inductor coil 9 and a secondary inductor coil 11. Certain topologies may use an inductor coil 9,11 in series or parallel connection as opposed to a transformer 7. In the fly-back configuration, the output of the primary coil current 6 induces a back emf in the secondary coil that draws secondary current 13. The secondary coil 11 output current flows through a diode 15, which supplies the circuit's conditioned DC output power 16 and charges a capacitor 17 that supplies current to the secondary coil 11. A switch controller 19 monitors the differential output voltage 16, power source voltage 3, and uses those inputs to modulate the power switch 5. As noted above, different power control circuit topologies will comprise at least one switch 5, one diode 15, one capacitor 17, and one inductor coil 9,11 or transformer coil 7, and one controller circuit 19. They may additionally comprise other passive (resistor, capacitor, and inductor) or active (diode or transistor switch) components not shown in FIG. 1 that fall under the scope of the present invention.

Figure 2:
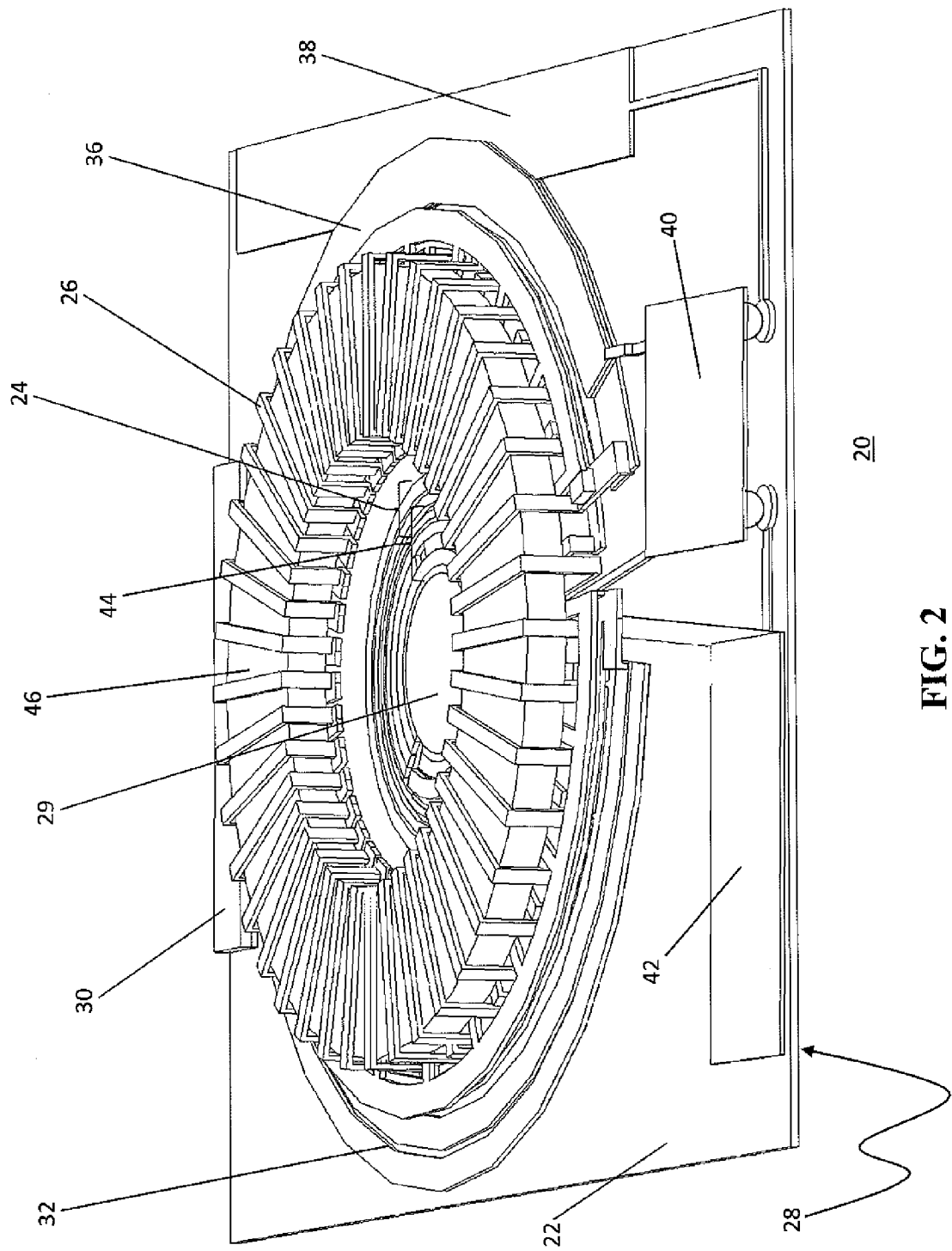
FIG. 2 depicts a monolithic power management module containing a surface FET.
Figure 3:
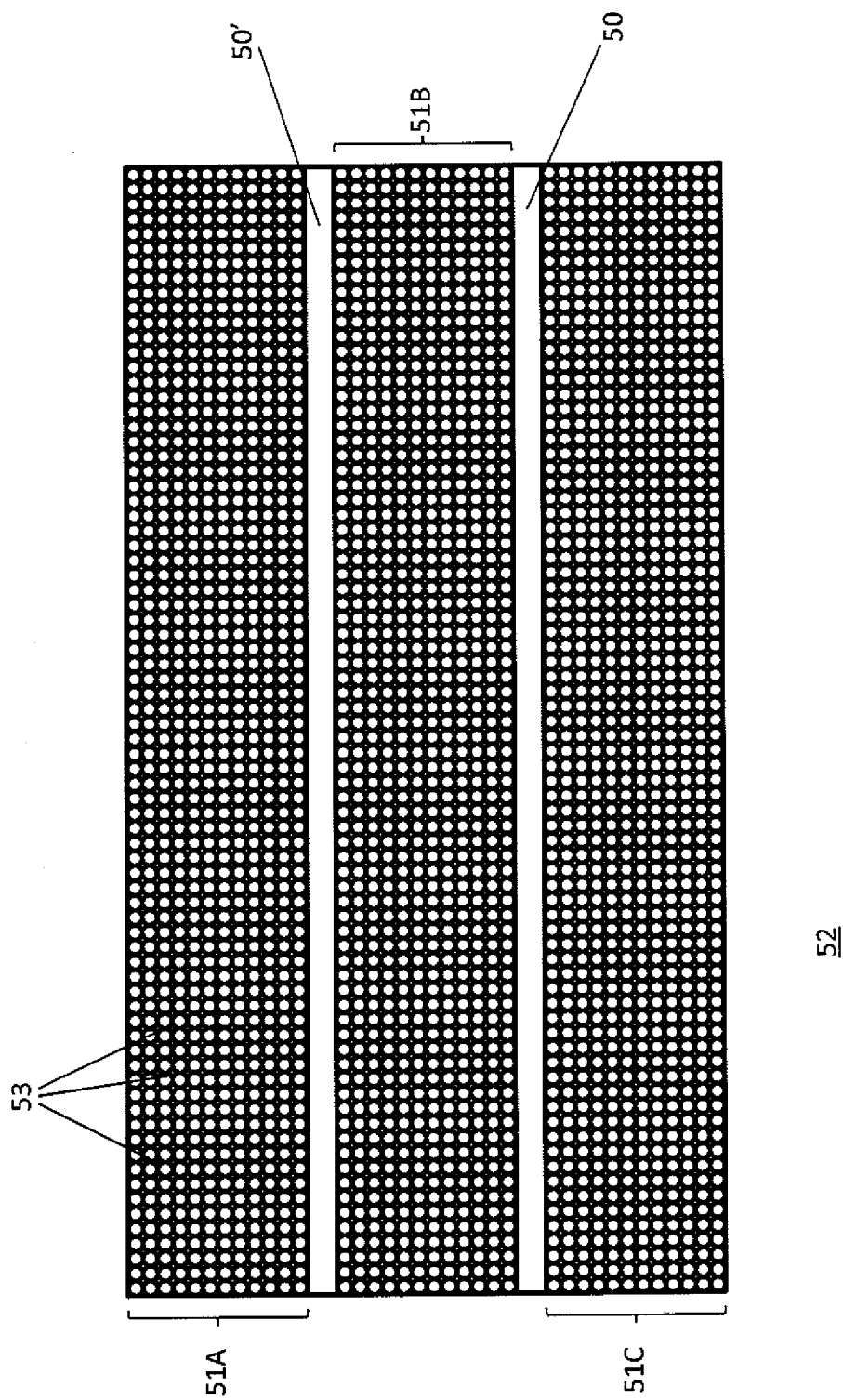
FIG. 3 illustrates a cross-sectional view of a low loss magnetic core material.
Figure 4:
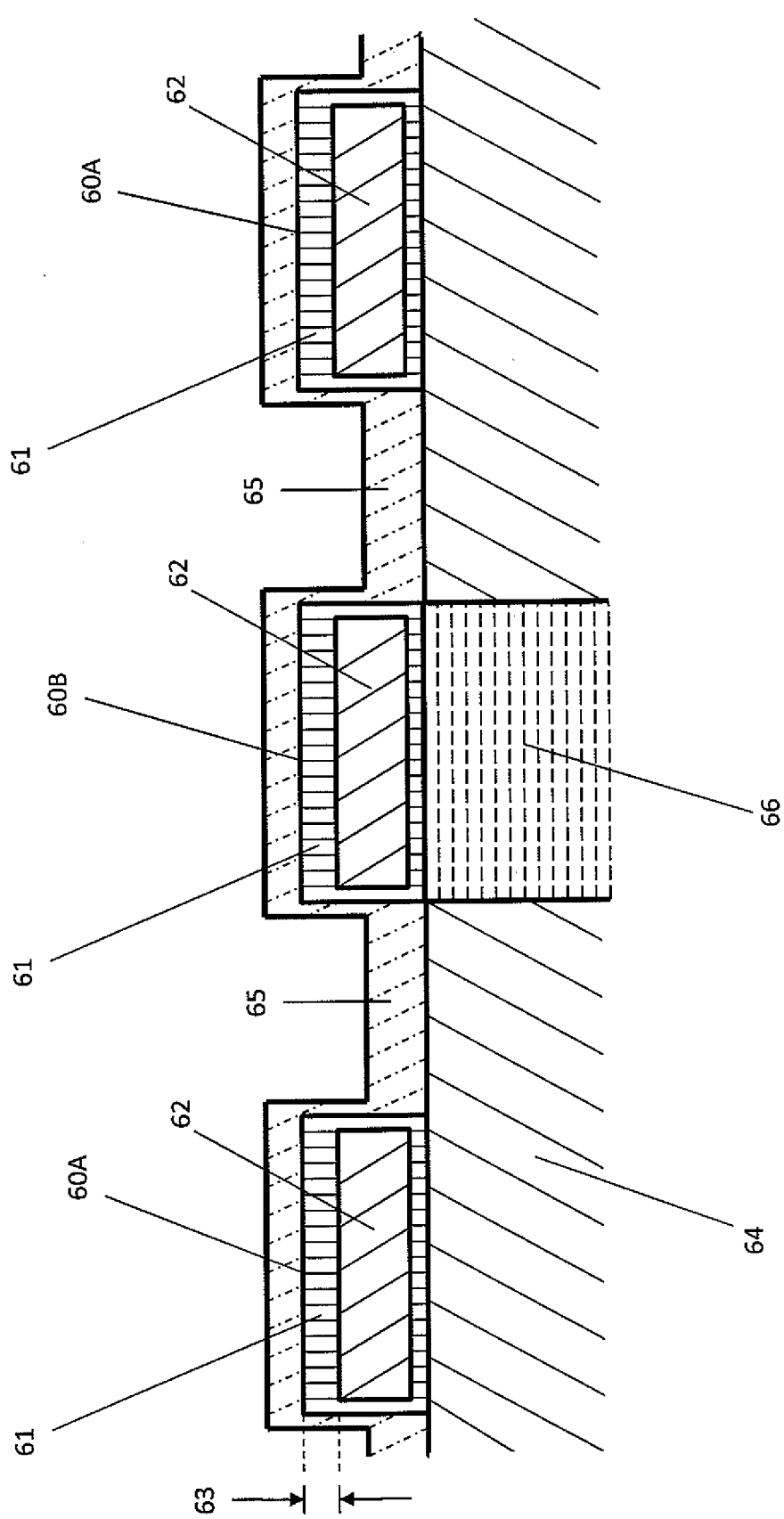
FIG. 4 illustrates mechanically reinforced inductor windings wrapped around a magnetic core with an amorphous silica gap.

FIG. 2 overviews a monolithic power management module 20 constructed using the LCD methods taught in the '222 application by de Rochemont on a semiconductor layer 22 that functions as the fly-back power management system 1 shown in FIG. 1. The power management module 20 modulates current by a surface FET 24 integrated on the semiconductor layer 22 that functions as the power switch 5. The surface FET 24 modulates current from the DC power source 3 (FIG. 1) to the primary coil 9 (FIG. 1) of a toroidal transformer coil 26. Current from the DC power source 3 (FIG. 1) is supplied to the monolithic circuit from a backside ground contact 28 through a first ground pad 29 that is in electrical communications with the backside ground contact 28 through a via (not shown). An output pad 30 on the top surface of the semiconductor layer 22 supplies conditioned DC output power 16 that has been regulated by the monolithic DC-DC power management circuit 20. An embedded diode 32 is circumferentially configured over part of the semiconductor surface area exterior to the toroidal transformer 26. The embedded diode 34 is in electrical communication with the output from secondary coil 11 (FIG. 1) of the toroidal transformer 26, while the other is in electrical communication with the output pad 30. On the opposite side of the toroidal transformer, a the bottom contact of a parallel plate capacitor 36 makes simultaneous electrical communication with a ground pad 38 located on the top surface of the semiconductor layer 22 and the input of the secondary coil 11 of the toroidal transformer 26. The control circuitry 19 (FIG. 1) may be configured as a surface-mounted controller chip 40 as shown in FIG. 7, or it may alternatively be embedded in the semiconductor layer (not shown) if its semiconductor material is compatible with those functions. Power input to the circuit is supplied to the primary coil 9 of the toroidal transformer 26 through an input pad 42. Additional circuitry 44 comprising active and passive components may be added as needed between the first ground pad 29 and the surface FET 24.

The toroidal transformer 26 minimizes EMI and current ripple in the power management module 20 by providing a closed path for magnetic currents circulating in the transformer structure and by forming a secondary inductor coil on the semiconductor layer that has its windings precisely interleaved between the windings of the primary inductor coil to mitigate flux leakage and proximity losses. High-frequency power losses in power management circuits are dominated by magnetic core losses, power FET losses, and conductor loss. Conductor loss is relieved by shortening conductor lengths, which are minimized through monolithic integration, and optimizing conductor geometry to a current's frequency-dependent skin depth. Hysteresis loss, eddy current, and residual loss are the principal mechanisms for magnetic core losses. LCD methods minimize hysteresis, eddy current, and residual magnetic loss in the magnetic core 48 of the toroidal transformer 26, by integrating compositionally complex high permeability magnetic core material, ($\mu_r \geq 10$, preferably $\mu_r \geq 100$) with the atomic scale chemical uniformity fluctuating $\leq 1.5$ mol %, which minimizes structural and compositional defects that produce hysteresis losses. Eddy current and residual losses are highly problematic in high-speed switched mode power supplies operated at switching speeds greater than 10 MHz. A particular aspect of the invention reduces eddy current and residual losses in the magnetic core 48 of an inductor or transformer component to drive DC/DC power management circuits at switching frequencies higher than 20 MHz, preferably frequencies higher than 500 MHz, while simultaneously managing input/output currents $\geq 10$ A.

LCD methods are used to deposit compositionally complex amorphous materials having precise composition and atomic-scale elemental uniformity on arbitrary material layers as discussed in detail in de Rochemont '159, de Rochemont '042, and de Rochemont and Kovacs '112, included herein by reference. This ability to selectively deposit amorphous or uniformly crystalline deposits, permit the construction of monolithic structures on semiconductor layers having active components buried beneath its surface. LCD methods deposit oxide ceramics when the materials are formed in oxygen atmospheres. Metals, alloys, superalloys, and semiconductors are integrated into the monolithic structures by processing the applied deposit in oxygen-free atmospheres.

A particular aspect of this invention address eddy current losses. The first method utilizes LCD to add non-magnetic elements comprising magnesium oxide (MgO), zinc oxide (ZnO), and copper oxide (Cu) into the magnetic core material to increase its resistivity to levels greater than $10^3$ $\Omega$-cm, preferably to levels greater than $10^7$ $\Omega$-cm, while simultaneously holding the desired high permeability, $\mu_R$. The second method shown in FIG. 3 optionally inserts at least one thin layer of amorphous silica 50,50' between layers of high resistivity, high permeability ceramic material 51A,51B,51C within the magnetic core 52 formed on the surface of a semiconductor layer. Amorphous silica is a formidable dielectric, endowed with a dielectric breakdown of 10,000 KV-cm$^{-1}$ and an electrical resistivity on the order of $10^{16}$ $\Omega$-cm, while having low dielectric constant ($\in_R=3.85$) and low dielectric loss (tan $\delta=2\times 10^{-5}$). A principal objective of the amorphous silica layer(s) 50 in combination with the high-resistivity, high permeability ceramic material 51 is to produce a magnetic core having an internal resistance greater than $10^5$ $\Omega$-cm$^{-3}$ per Watt of acceptable loss at a given switching frequency. This level of internal resistance ($\rho_{internal}$) will reduce eddy current losses within the magnetic core to levels less than 0.5 mW-cm$^{-3}$, preferably to loss levels less than or equal to 20 $\mu$W-cm$^{-3}$. These high internal resistance levels enable this aspect of the invention to be applied to managing power levels of 500 W or more. Magnetic core materials are selected based upon the desired operational switching speed. Preferred electroceramic compositional families for various ranges of switching frequency for the intended application are shown in Table 1.

TABLE 1

| Electroceramic Family | | | |
|---|---|---|---|
| | Ferrite | Hexaferrite | Garnet |
| Frequency Range | $\leq 50$ MHz | 20 to 3,000 MHz | $\geq 1,000$ MHz |
| Compositional Formula | $M_1Fe_2O_4$ | $AB_{12}O_{19}$ | $A_3B_2(SiO_4)_3$ |
| Elemental Substitutes | M = Co, Ni, Zn, Cu, V, Mg, Li | A = Mg, Ca, Sr, Ba, Sc, Cu, Zn<br>B = Fe, Bi, Y, Al | A = Ca, Mg, Fe, Sr, Sc, Mn, Ba, Cu, Zn<br>B = Al, Fe, Bi, Cr, V, Zr, Ti, Si, Y, Co, Gd, Nd, Ho |
| Crystallographic Structure | Spinel, Body-centered cubic | Hexagonal | Rhombic, Dodecahedron or Trapezohedron |

Yet another aspect of this invention applies the LCD process to formulate high permeability magnetic material having low residual loss, which is a dominant loss mechanism above 10 MHz. This aspect of the invention utilizes LCD's ability to formulate a complex ceramic composition with uniform grain size diameter 53, wherein 100% of the grains have diameters less than 1.5× the mean grain size diameter, and said grain mean size diameter less than 5 $\mu$m, preferably having grain size in the range of 1 $\mu$m to 5 $\mu$m.

In high power density applications, the electromagnetic energy density is sufficient to induce electromechanical forces that will mechanically displace the coil windings at high power levels. This mechanical displacement will destroy the equal spacing between primary and secondary coil windings, which will induce proximity and flux leakage losses, and could lead to catastrophic failure of the device. LCD methods are used to mechanically reinforce windings against displacement and catastrophic failure as depicted in cross-section in FIG. 4. The mechanically reinforced transformer windings 60A,60B comprise thin layers of high electrical conductivity material 61, preferably but not necessarily copper conductor and might also comprise superconducting material, that envelop a hard mechanical constraining member 62. The mechanical constraining member 62 may consist of a hard, low-expansion elemental metal, such as tungsten or molybdenum, or it may comprise an alloy or superalloy, such as kovar, invar, or any other well-known low-expansion material that has a measured hardness value that is at a minimum twice (2×) the measured hardness value of the high electrical conductivity material 61. The thickness 63 of the high conductivity layer 61 should range from 0.5× to 10× the ac skin depth at the device's optimal operating or switching frequency. The coefficient of thermal expansion (CTE) is a critical parameter in the selection of the hard mechanical constraining member 62, and should match to within 25%, preferably within 10% of the coefficient of thermal expansion of the dielectric material(s) with which the high electrical conductivity material 61 is in physical contact. In designs where the high electrical conductivity material 61 is in contact with a plurality of adjacent dielectrics, such as the magnetic core 64 and an insulating dielectric 65, it is preferred that the CTE of the hard mechanical constraining member 62 mechanically match the adjacent material 64,65 having the lower CTE. An additional aspect of the present invention uses amorphous silica as the insulating dielectric 65 to prevent corona discharges (or dielectric breakdown if less strong insulators are used) between windings of the primary and secondary coils. Amorphous silica is the lowest loss (tan $\delta=2\times 10^{-5}$) and most robust (threshold of dielectric breakdown of 10,000 KV-cm$^{-1}$) dielectric insulator ($\cong 10^{16}$ $\Omega$-cm).

A further additional aspect of the present invention utilizes forms a toroidal magnetic core having gaps in the magnetic material that are filled with an ultra-low loss material, preferably filled with amorphous silica. It is well-known to practitioners skilled in the art of transformer coil design that "air gaps" concentrate magnetic energy. Locating "air gaps" 66 in the magnetic core 64 to be adjacent to at least one secondary coil winding 60B increases power coupling between the primary coil 60A and secondary coil 60B windings.

Reference is now made FIGS. 5-8 to illustrate aspects of the invention that further improve the power and thermal efficiencies of a power management module through the monolithic integration of a vertical power FET to boost power (current) levels through the structure while minimizing thermal loads. Insulating dielectric material 65 (FIG. 4) used to electrically isolate windings and traces, or as physical layers in the monolithic construction of the power management module, has been removed in most instances from FIGS. 5-8 for clarity.

Figure 5B:
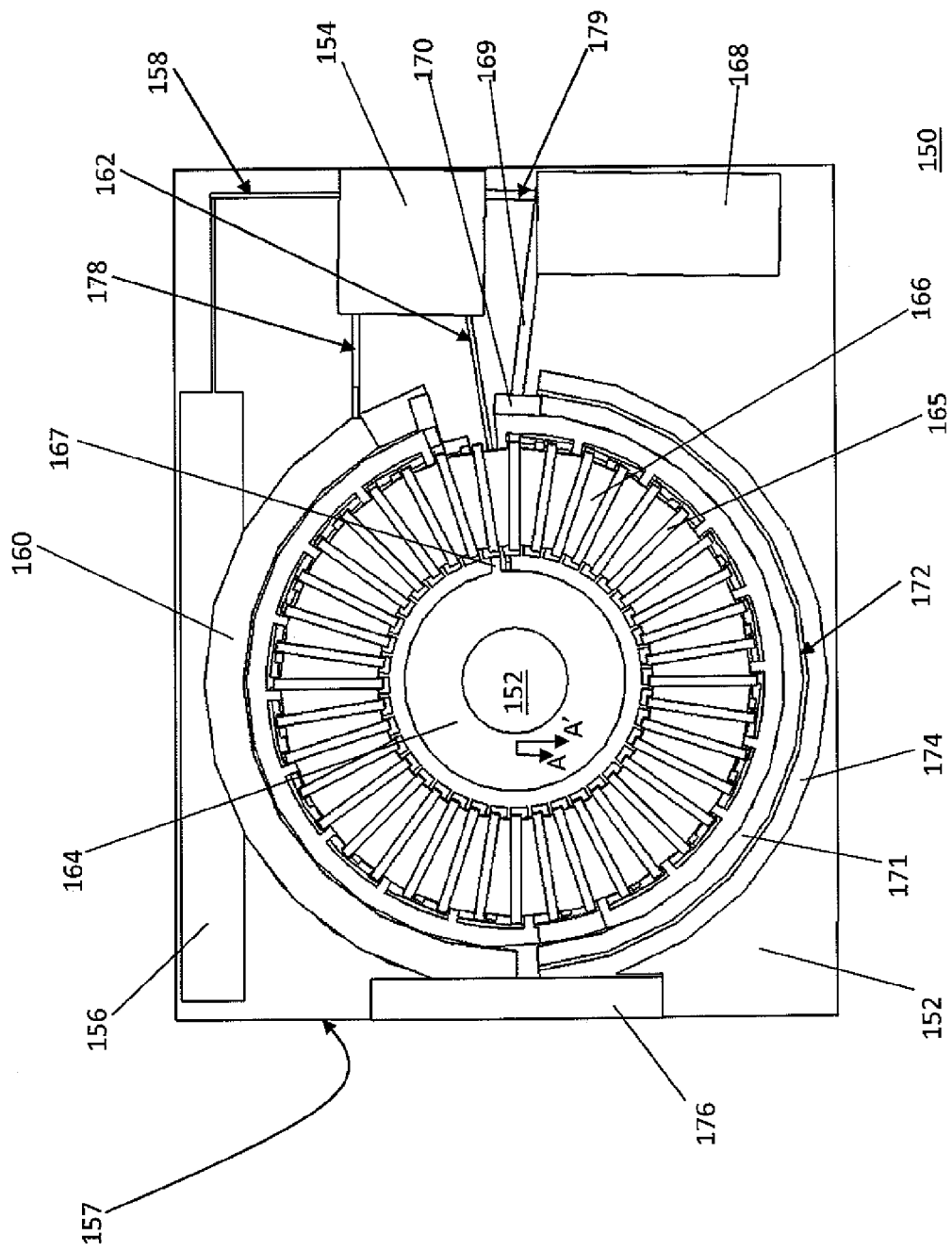
FIG. 5B is a top view of monolithic power management module with DDMOS vertical power FET containing an elongated resonant gate.

FIGS. 5A,5B,5C,5D,5E illustrate alternative structures to the monolithic power management module 20 shown in FIG. 2 that improve management of high current loads by utilizing a vertical power FET 100 in lieu of the surface FET 24. The term "vertical power FET" is herein understood as a field effect transistor that uses electrodes applied to, and electronic dopant profiles patterned on the surface of and within one or more semiconductor layers to modulate current drawn through the semiconductor layer(s). FIG. 5A is a cross-sectional view of line segment A-A' of the monolithic power management module with a vertical FET 150 depicted in FIG. 5B. The term "vertical power FET" refers to a field effect transistor that uses electrodes applied to a semiconductor layer that has electronic dopant profiles patterned on its surface and within one or more semiconductor layers to modulate current drawn through the semiconductor layer(s). The vertical power FET 100 draws current 102 through a semi-insulating n-type semiconductor layer 104 from an n$^+$-type semiconductor drain layer 106. The semiconductor drain layer 106 may be a chip carrier substrate (discussed below) or an additional semiconductor layer deposited on a ground electrode 107. The active junction that modulates the current drawn through this structure is formed by diffusing or implanting p-type dopants to form sub-channel regions 108 and n type regions 110 to complete the NPN junction transistor circuit. Gate electrodes 112 are embedded in amorphous silica dielectric 114 (the gate oxide) and are used to modulate the passage of current 102 through the channel region 116 to the source electrode 118, which is in electrical communication with the power management module's primary inductor coil.

The "On" resistance is a critical operational parameter of all power FETs, since higher resistivity generates more heat, which, if not properly managed, will produce higher temperatures in the channel region that will degrade transistor performance. The On resistance ($R_{ON}$) of a standard power FET is the sum of the channel resistance ($R_{Ch}$) and the drain resistance ($R_{Drain}$) and is mathematically characterized using:

$$R_{ON} = R_{Ch} + R_{Drain} \quad (1A)$$

$$= \frac{L_{gate}}{W_{gate} C_{gate} \mu_{elec}(V_G - V_{GS(sh)})} + k\rho_{Drain} \quad (1B)$$

Where,
$L_{gate}$ is gate length 250,
$W_{gate}$ is the gate width 251,
$C_{gate}$ is the gate capacitance,
$\mu_{elec}$ is the electron mobility of the semiconductor layer 104,
$V_G$ and $V_{GS(sh)}$ are the gate and short-circuited gate-source voltages, respectively,
k is a geometrical factor related to the source electrode geometry,
and,
$\rho_{Drain}$ is resistivity of the semiconductor drain comprising layers 304 and 306.

The gate length 250 $L_{gate}$, when viewed in cross-section, is the width of the gate electrode 112 as depicted in FIGS. 5A&5E. Similarly, the gate width, $W_{gate}$, 251 would extend above and below the plane in the cross-sectional view provided in FIGS. 5A,5C,5E, and is the sum total length of the active serpentine gate electrode 180 (112/240) depicted in FIGS. 5A,5C,5E.

FIG. 5B depicts a top perspective view of a power management module with a vertical FET 150 configured for operation as a flyback DC-DC converter circuit 1. The present invention is not restricted to flyback converter configurations and may be used to construct additional DC-DC converter circuits known to practitioners skilled in the art of power management using the methods and embodiments instructed herein. These methods and embodiments are also useful in constructing other power management devices, such as AC-DC/DC-AC inverters or AC-AC transformers, which are similarly benefited by the invention and considered to be additional embodiments.

The physical design (top perspective) depicted in FIG. 5B consists of the electrically patterned n-type semiconductor layer 152 (104 in cross-sectional view) in which active power FET(s) and diode(s) may be located. The switch controller unit 154 may also be embedded in the semiconductor substrate or it may alternatively be mounted as an additional chip on the surface of the n-type semiconductor layer 152. One or more additional ground contact pads 156 and 157, with one ground contact pad 156 applied to the top surface to establish a ground control circuit connection 158 to the switch controller unit 154 or to the bottom electrode of output capacitor 160, which may be an ultra-capacitor. A gate control circuit connection 162 is made to the insulated transistor gate (not shown in FIG. 5B), which is buried beneath the source electrode 164 (118 when viewed in cross-section as shown in FIG. 5A). The insulated transistor gate modulates current drawn from the underside ground contact 157 to the source electrode 164, through the vertical power FET 100, which supplies the drawn current to the primary coil of a toroidal transformer 165 formed around a magnetic core 166. The primary inductor coil of the toroidal transformer 165 is electrically connected to the source electrode 164 at the primary coil input 167 and to an input power contact pad 168 at the primary coil output 169. The input power contact pad 168 is in electrical communication with an outside power source. The secondary coil's output 170 is in electrical communication with a circumferential electrode 171 that partially surrounds the toroidal transformer 165 and is in electrical communication with the input of a diode (p-n junction) 172 buried in the n-type semiconductor layer 152. An additional circumferential electrode 174 that partially encompasses the toroidal transformer 165 is in simultaneous electrical communication with the output of the diode (p-n junction) 172 and the module output pad 176 that supplies conditioned power current to the load. The input 177 (not shown) to the secondary coil is located on the opposing side of the toroidal transformer 165. It is in electrical communication with the bottom electrode of the output capacitor 160, which is also in communication with electrical ground through ground contract pad 156. The top electrode of the output capacitor 160 is in electrical communication with the output pad 176. An output control circuit connection 178 is made to the top electrode of the output capacitor 160. The control circuit connection 178 may be made, as is most convenient, directly to the output pad 178, or to the additional circumferential electrode 174 in electrical communication with output of the diode 172 or to the output electrode of the output capacitor 160 as they are all in electrical communication with one another. A power input control circuit connection 179 is made between the switch controller unit 154 and the power input contact pad 168. It is herein also implied that other control circuitry may be added to the fully integrated circuit module that would add greater processor functionality and require additional electrical traces to maintain proper electrical communication.

A specific embodiment of the present invention is to mitigate heat generated by the device by using a large three-dimensional structure to reduce $R_{ON}$ with a properly configured gate electrode. FIG. 5C provides a magnified top perspective view of a fully integrated power management module with the source electrode 164 removed to expose a serpentine FET gate electrode 180 that has an elongated gate width wound circumferentially on the region of the n-type semiconductor layer 152 located within the "donut hole" of the toroidal transformer 165. The insulated gate electrode is naturally formed over matching patterned doping profiles implanted or diffused into the semiconductor substrate to reproduce the electronic profile patterned defined in FIG. 5A (when viewed in cross-section) throughout the entire region over which the insulated gate electrode is overlaid. Each circumferential winding or loop of the gate electrode is electrically connected to the next inner circumferential gate electrode interior.

This model representation of the present invention depicts an FET gate electrode that has a 100 μm gate length 250 ($L_{gate}$) and a 1 meter wide gate width 251 ($W_{gate}$) to make it easier to visualize pictorially. It could just as easily comprise an FET gate electrode that a 1 μm long (or smaller) gate length 250 ($L_{gate}$) and a 50 meter wide (or wider) gate width 251 ($W_{gate}$) within the same surface area. A specific embodiment of the invention is to establish a gate electrode structure wherein the gate width 251 ($W_{gate}$) is at least two orders of magnitude, preferably more than 6 orders of magnitude, greater than the gate length 250 ($L_{gate}$). i.e., $10^2 \leq W_{gate}/L_{gate}$, preferably $10^6 \leq W_{gate}/L_{gate}$. The gate electrode is in electrical communication with the gate control circuit connection 182, which, preferably is a ground shielded trace. A larger feed electrode 184 is used to connect the source electrode 164 to the primary inductor coil of the toroidal transformer 165. The feed electrode may comprise varying thicknesses and geometries, such as a ring, to improve current handling characteristics.

Making reference to equations 1A & 1B, it is quite evident that the gate geometry described by the present invention enables a substantial reduction in "On Resistance" ($R_{ON}$) by reducing its channel resistance ($R_{Ch}$) component, which is inversely proportional to the ratio of the gate width 251 to the gate length 250 $W_{gate}/L_{gate}$. For example, a gate geometry wherein the ratio of the gate width 250 to gate length 251 $W_{gate}/L_{gate}$ is $10^6$ will have 1 1/millionth the channel resistance of a gate electrode where the ratio of the gate width 250 to gate length 251 $W_{gate}/L_{gate}=1$. There are corresponding reductions in the drain resistance $R_{Drain}$, since the geometrical factor, k, for the source electrode 164 is the ratio of the thickness of the high resistivity n-type semiconductor layer 104 to the surface area of the source electrode 164. The source electrode 164 depicted does not necessarily have to have a hole in its center as depicted in FIG. 5B. When there is a donut hole at its center, the source electrode's total surface area is determined as the area spanned by the outer radius minus the area spanned by the inner radius, or:

$$A=\pi(R_{out}^2-R_{in}^2) \qquad (2)$$

where, $R_{in}=0$ when there is no hole at the center. Ordinarily, the thickness of the n-type semiconductor layer 104 (152) is 5 μm ($5\times10^{-4}$ cm) or less. When the source electrode has an outer radius on the order of 1 cm with an inner radius of 0.4 cm, the total surface area of the donut is 2.51 cm² making the geometrical factor $k=2\times10^{-4}$, assuming a semiconductor layer 104 thickness of 5 μm. In designs where the layer thickness can be reduced to 2 μm and the source electrode is expanded to 2 cm radius with no donut hole, the geometrical factor becomes $k=1.6\times10^{-5}$.

Figure 5D:
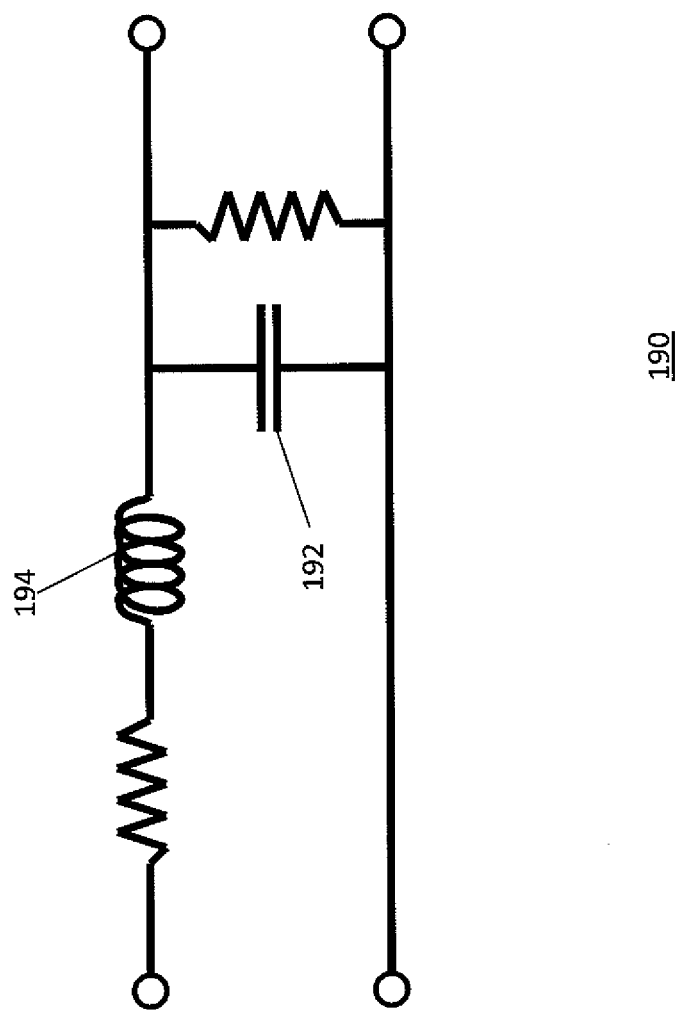
FIG. 5D illustrates an equivalent circuit representation of a transmission line segment.

The greatly expanded size of the source electrode 164 lowers heat generated by the power FET by lowering its On Resistance ($R_{ON}$) by orders of magnitude. The elongated gate width also increases gate capacitance ($C_{gate}$), which also reduces $R_{ON}$, but sharply lowers gate switching speeds. A lower switching speed can be alleviated by designing the elongated gate structure as a transmission line and configuring the serpentine FET gate electrode 180 to be resonant at a particular frequency of interest. A given segment of the serpentine FET gate electrode 180 contains a capacitive element, determined by the charge that is collected beneath the gate, a resistive element determined by the thickness, length and cross-sectional area of the conductor used to form the serpentine FET gate electrode 180, and an inductive element formed by half-turns 186 that loop the serpentine winding back upon itself. Any serpentine pattern can be distributed within the volume of the source electrode, though it is preferred to configure the serpentine pattern in a manner that produces a resonant FET gate electrode 190 that has a characteristic resonance ($\omega_o$) defined by a transmission line per unit length internal capacitance (C) 192, and inductance (L) 194, $$\omega_o=2\pi f_o=1/\sqrt{(LC)} \qquad (2)$$

as shown in FIG. 5D. Methods that utilize LCD techniques to construct a "resonant transistor gate" from an elongated gate structure that incorporates tight tolerance passive components within the gate structure are instructed in de Rochemont '894 copending with this application.

Figure 6:
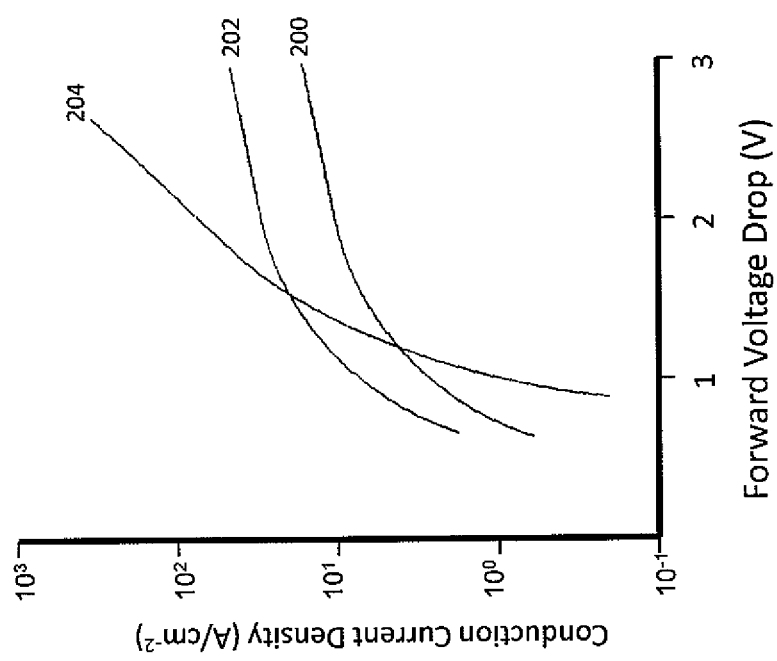
FIG. 6 contrasts the current carrying capabilities of various vertical power FETs.

As shown in FIG. 6, certain vertical FET architectures allow different current densities to be switched through the circuit. In general, double-diffused power FET (DDMOS-FET) architectures 200 achieve the lowest current densities, bipolar transistors 202 achieve higher current densities, and insulated gate bipolar transistors (IGBT) 204 provide the highest current densities. Therefore, the current load objectives are used to determine which type of FET architecture should be integrated into the monolithic power management module with a vertical FET 150. Bipolar 202 and DMOSFET 200 architectures are suitable for lower instantaneous current loads, say less than 50 A, whereas IGBT architectures are preferred for higher instantaneous current loads. FIG. 5E depicts an alternative A-A' cross-sectional view of a monolithic power management module with IGBT vertical FET 220; which may optionally include a substrate 222 and electrode 224 that functions as ground and a heat sink. LCD enables the insertion of a very thin amorphous layer 226 that allows a single crystal p⁺-type semiconductor drain layer 228 to be deposited upon the drain electrode 224. A p-n junction 230 forms between the semiconductor drain layer 228 and an n-type semiconductor layer 232. The n-type semiconductor layer 232 is electrically patterned with p-type subchannel 234A,234B,234C and n+-type dopant profiles 236A,236B, 236C,236D that are in electrical communication with the source electrode 238. The insulated gate electrode 240 modulates inversion carrier populations in a channel 242 that allow currents to flow from the drain 228 to the source electrode 238. The gate electrode 240 is encapsulated within a low loss high-dielectric breakdown insulating material 242A,242B, preferably an amorphous silica insulating material.

Power FET switching speed is generally limited to clock frequencies well below 1 GHz, more typically these switching speeds are constrained to clock frequencies well below 500 MHz. Lower switching speeds are a particular problem with IGBT power FETs because the additional p-n junction adds additional recombination currents. Lower switching speeds require larger inductor and capacitor elements to be added to the power management circuit, which comprises size and economic value. These low switching speeds are constrained by the electron mobility in silicon ($\mu_{elec}$=1,300 cm$^2$-V$^{-1}$ sec$^1$) and are the principal cause of inadequate memory management that is the principal cause for underutilized microprocessor capacities. It is therefore a principal embodiment of this invention to integrate power FET devices into the chip carrier that simultaneously reduce thermal management issues and increase switching speeds to levels that substantially improve localized high-speed computing. This is achieved through LCD technology's ability to integrate mismatched materials into a functional device by substituting semiconductor materials that have higher electron mobility $\mu_{elec}$ into any of the semiconductor layers 104,106,228,232. Improved electron mobility not only serves to reduce $R_{Ch}$ to relieve thermal management issues and stabilize junction dynamics under high operational current loads, it also increases recombination currents in the channel region to increase overall switching speeds.

Therefore, it is desirable to utilize semiconductors, such as silicon germanium (SiGe), germanium (Ge), gallium arsenide (GaAs), gallium nitride or other III-V compound semiconductors, or when the application warrants, II-VI compound semiconductors, which have higher electron mobility or better thermal properties than silicon (Si). In particular, it is preferred embodiment of the present invention to use the III-V compound semiconductor indium-antimonide (InSb) which has an electron mobility $\mu_{elec}$=77,000 cm$^2$-V$^{-1}$ sec$^{-1}$ in the deposited transistor structure. Compound semiconductors exhibiting such high carrier mobility typically have narrow energy band gaps and require the FET structure to be configured in such a way to form either 2-dimensional (2D) electron gas using layered structures or a three-dimensional (3D) electron gas as instructed in de Rochemont '846.

A particular aspect of the invention integrates the monolithic power management module modulated by a vertical FET 300 on a semiconductor substrate 302 as shown in FIGS. 7A,7B,7C,7D,7E. It includes a toroidal transformer 304 with interleaved mechanically reinforced coil windings, wherein two or more segments of either the primary or the secondary coil are wound in parallel, a plurality of semiconductor layers 306,308, ground electrodes 310,312, a parallel plate capacitor 314, a diode 316, a switch controller unit 318, a power input pad 320, a power output pad 322, and additional circuitry 324 consisting of passive and active components. Although the additional circuitry 324 is shown for illustrative purposes in FIG. 7A as feeding the switch input electrode 326 to the resonant gate vertical power FET 327 (not visible in FIG. 7A) that modulates current to the source electrode 328 in electrical contact with the primary inductor coil of the toroidal transformer, the additional circuitry 324 may be used to serve any function and located on any layer surface in the power management module 300 or the semiconductor substrate 302.

Figure 7A:
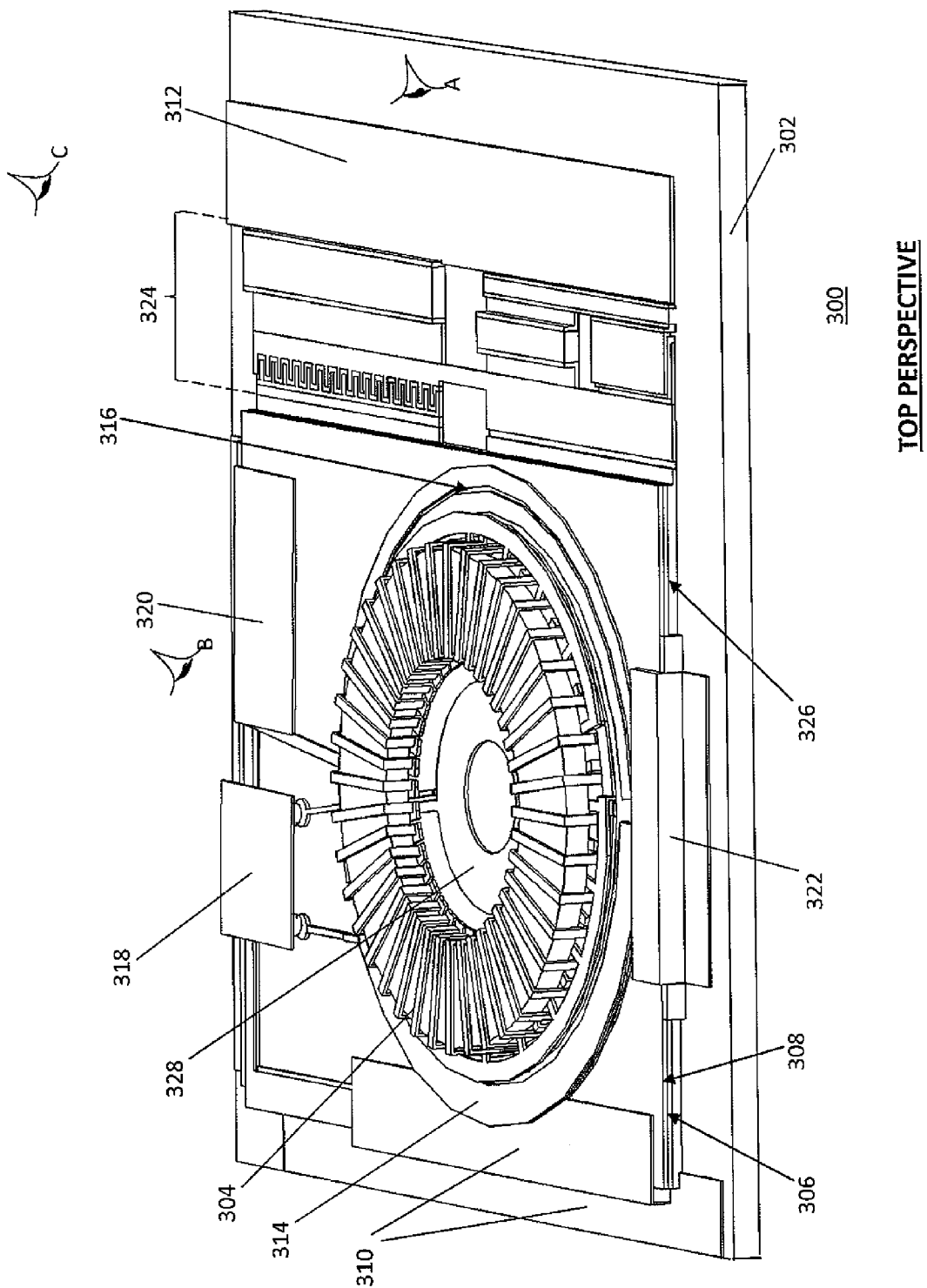
FIG. 7A shows a top perspective view of a monolithic power management device containing a vertical power FET with an elongated resonant gate.
Figure 7B:
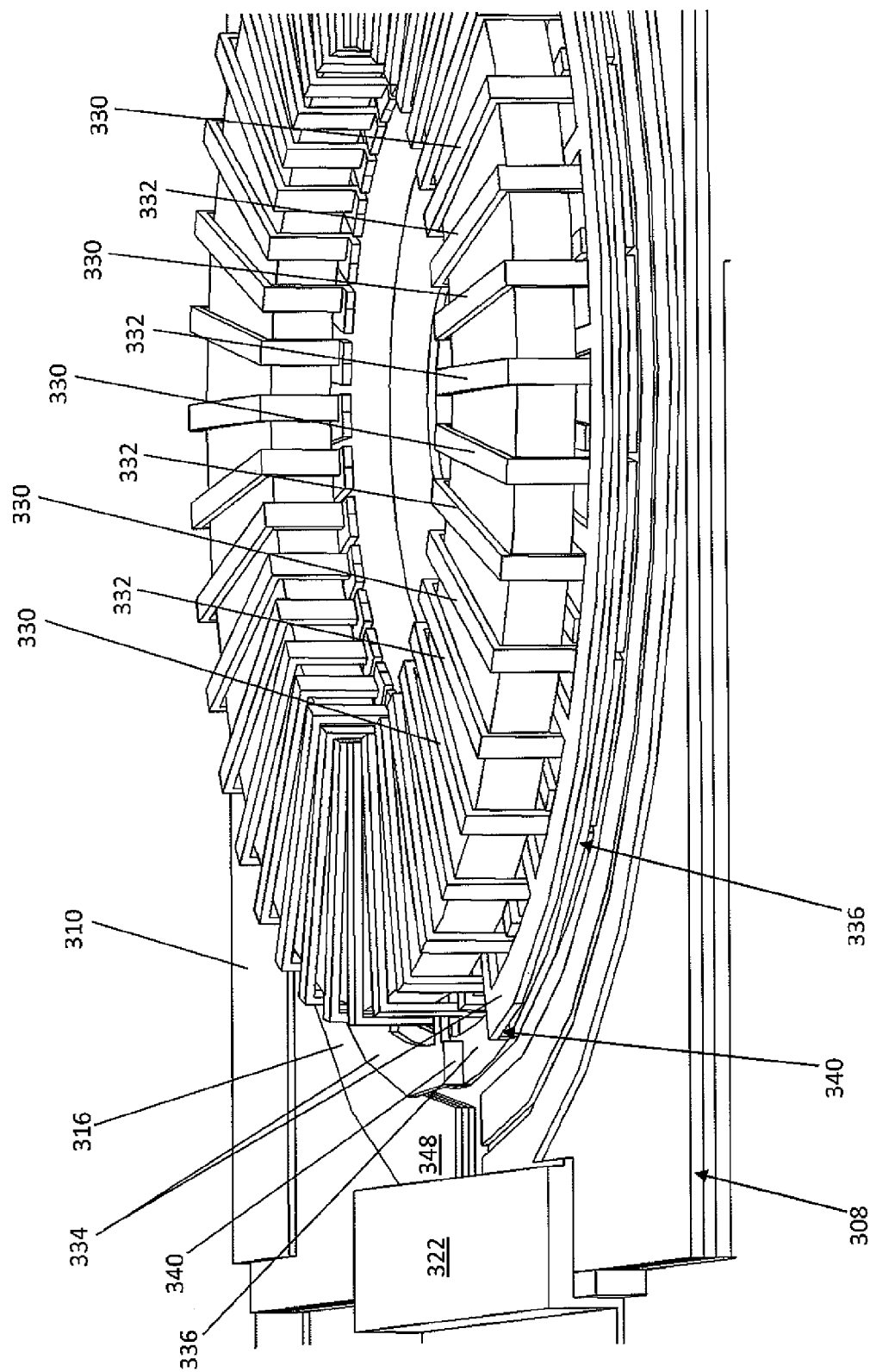
FIG. 7B is an alternative perspective view of a monolithic power management device containing a vertical power FET with an elongated resonant gate.
Figure 7C:
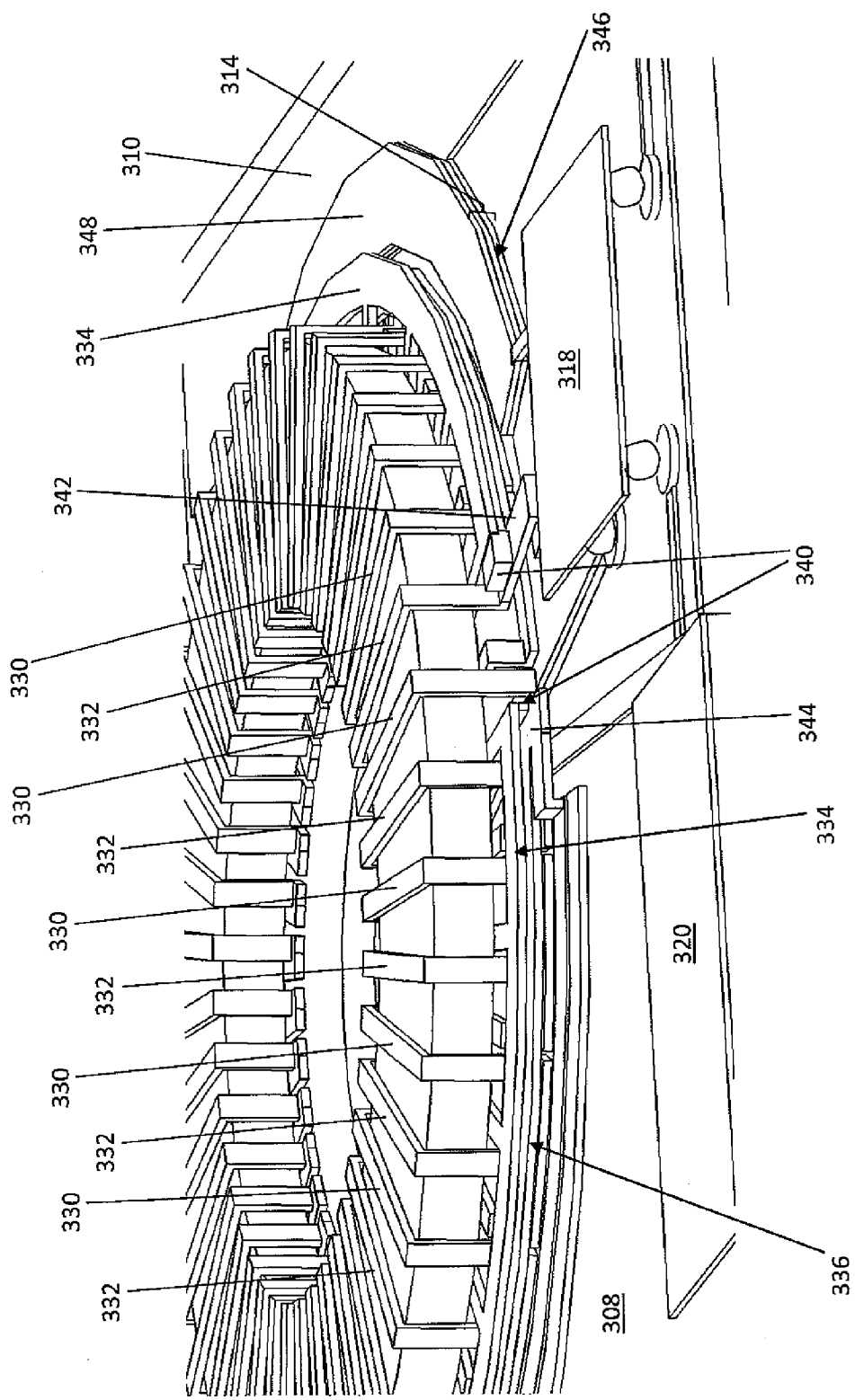
FIG. 7C is another alternative perspective view of a monolithic power management device containing a vertical power FET with an elongated resonant gate.
Figure 7D:
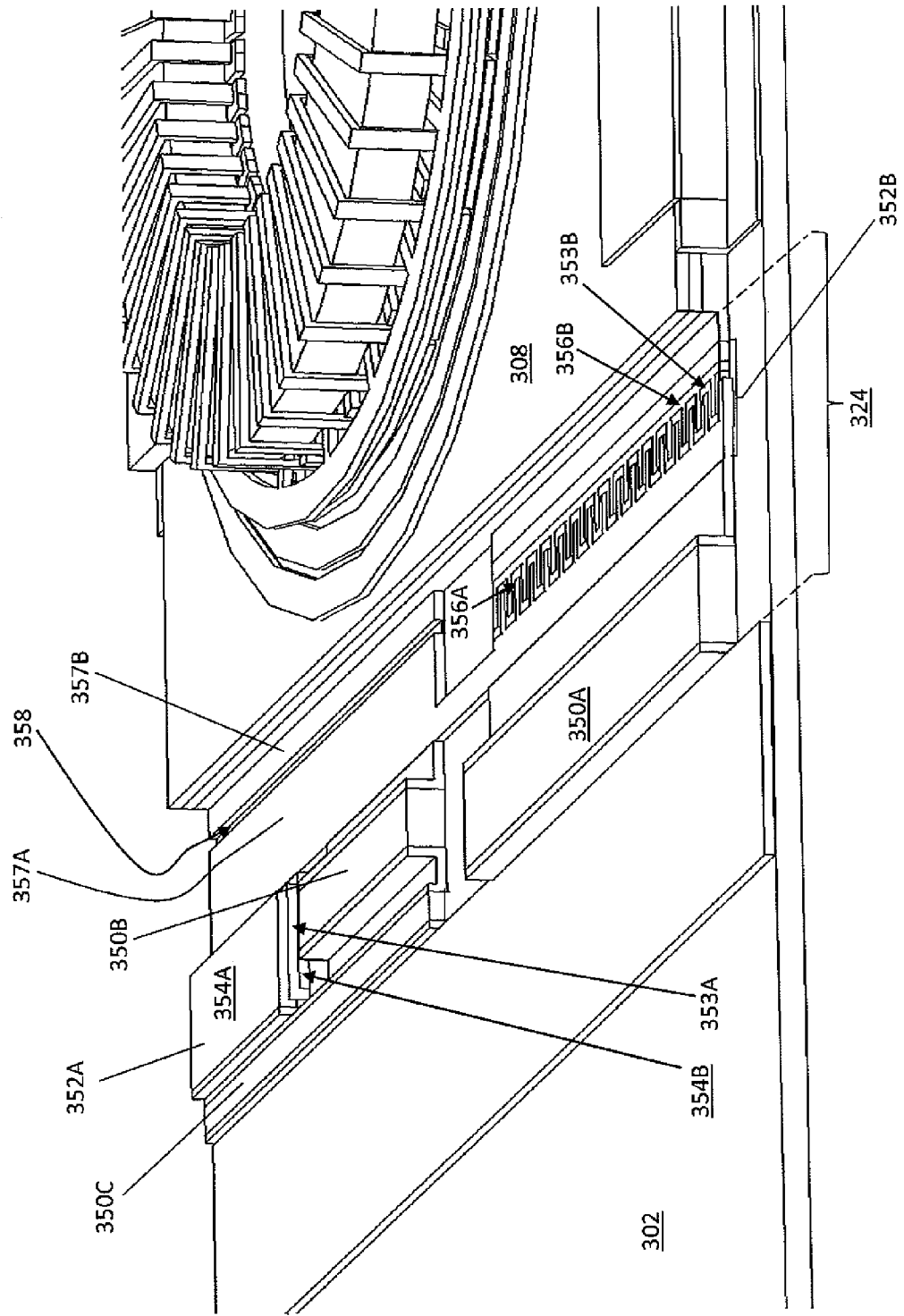
FIG. 7D is a top perspective view of additional circuitry contained in a monolithic power management device containing a vertical power FET with an elongated resonant gate.

Two or more parallel winding segments permit the construction of a transformer having arbitrary turn-ratios, as well as low proximity and flux leakage losses made possible by the consistent spacing between windings of the primary and secondary coils. Two or more parallel winding segments are inserted into the primary coil when a step-up transformer is desired. Conversely, two or more parallel winding segments are inserted into the secondary coil when a step-down transformer is desired. FIGS. 7B,7C illustrate a monolithic module having a 10:1 step-down transformer constructed using the methods disclosed in de Rochemont '222. The primary coil windings 330 are configured as 20 turns wound in series by first depositing the bottom winding conductor segments on the surface of the n-type semiconductor layer 302. The secondary coil windings 332 are configured as two 10-turn winding segments, with each winding segment having 10 turns wound in parallel. The parallel turns are achieved by terminating the individual parallel winding on upper 334 and lower 336 outer ring conductors, which are electrically insulated from one another by an insulating dielectric material 338 (not shown), preferably an amorphous silica insulating dielectric. Parallel winding terminations 340 that electrically contact the upper outer ring conductor 334 to the lower outer ring conductor 336 are located at the secondary coil input 342 and output 344 and the beginning or ending of a parallel-turn segment. In this configuration, the two parallel turn segments are connected in series by electrical connection through the lower ring conductor 336. The secondary coil input 342 is in electrical communication with the bottom electrode 346 of the parallel plate capacitor 314 and the ground pad 310. The top electrode 348 of the parallel plate capacitor 314 is in electrical communication with the power output pad 322.

Figure 7E:
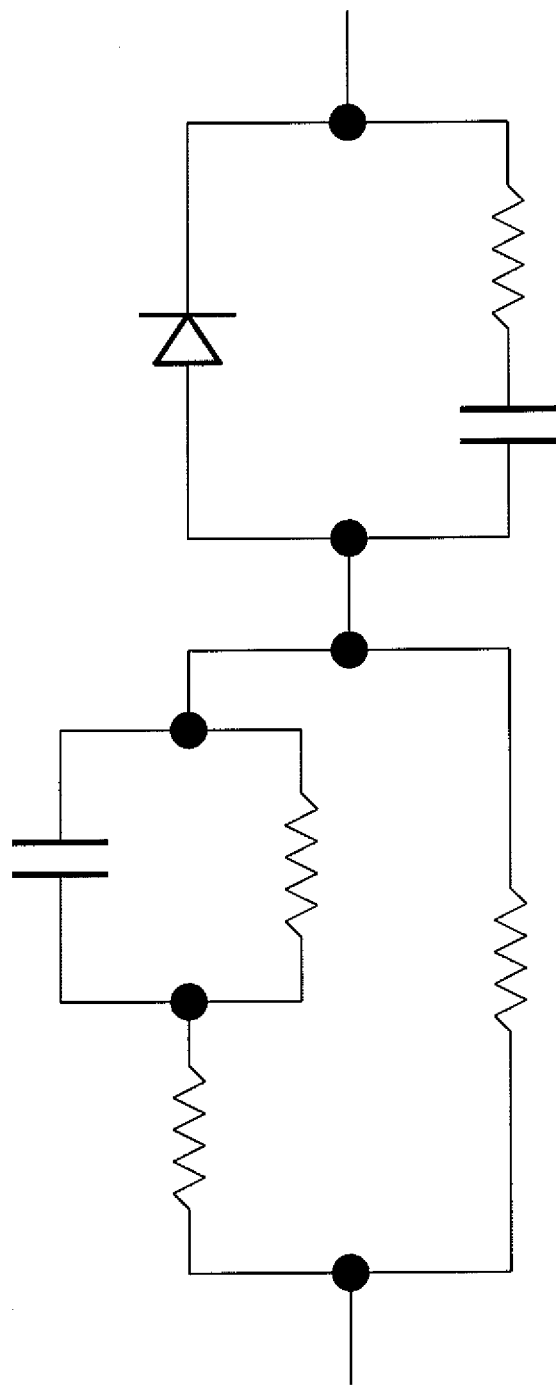
FIG. 7E is an equivalent circuit diagram of the additional circuitry depicted in FIG. 7D.

LCD methods are used to construct the additional circuitry 324 by selectively depositing metal and dielectric material that form the passive or active component. Using these techniques and referring to FIG. 7D, the circuit diagram 349 in FIG. 7E is replicated on the semiconductor substrate 302 by selectively depositing resistive dielectric material to form resistors 350A,350B,350C. Capacitors 352A,352B may be formed by depositing capacitive dielectric 353A between parallel electrodes 354A,354B in vertical fashion, or by selectively depositing capacitive dielectric 353B within inter-digitated electrodes 356A,356B. Active devices, such as diodes, are formed by selectively depositing electrodes to make contact with the inputs and outputs of an electronically doped region 358 of the semiconductor substrate 302.

A further aspect of this invention relates to the integration of at least one inductor or transformer coil enveloped around a low-loss (≤0.5 mW-cm$^{-3}$), high permeability ($\mu_R$≥70) magnetic core material that is fully integrated on to a semiconductor layer. Fully integrated systems achieve dramatically higher field reliability and sharply lower cost. While transistor assemblies have been integrated into semiconductor die, the inability for powder-based or paste-based ceramic manufacturing to maintain performance values within "critical tolerances" has made system-on-chip passive assemblies cost prohibitive due to the inability to rework an out-of-tolerance passive component once it is integrated into a solid state structure.

Figure 8A:
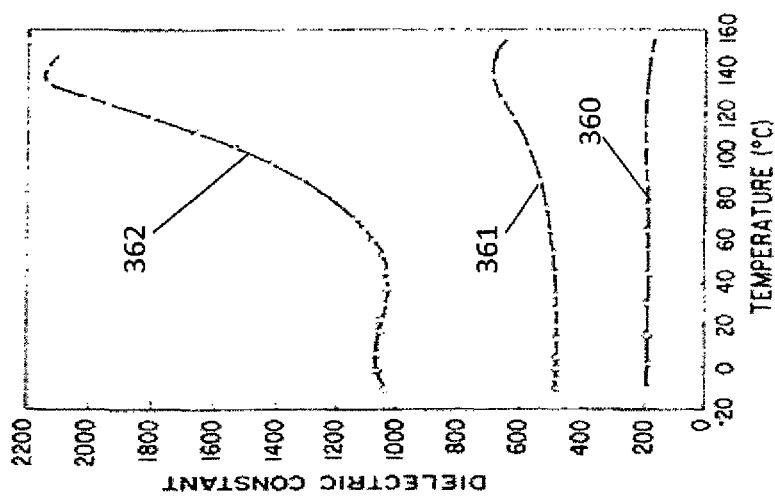
FIG. 8A illustrates the variation in the relative permittivity of a perovskite electroceramic as a function of temperature at various grain sizes.
Figure 8B:
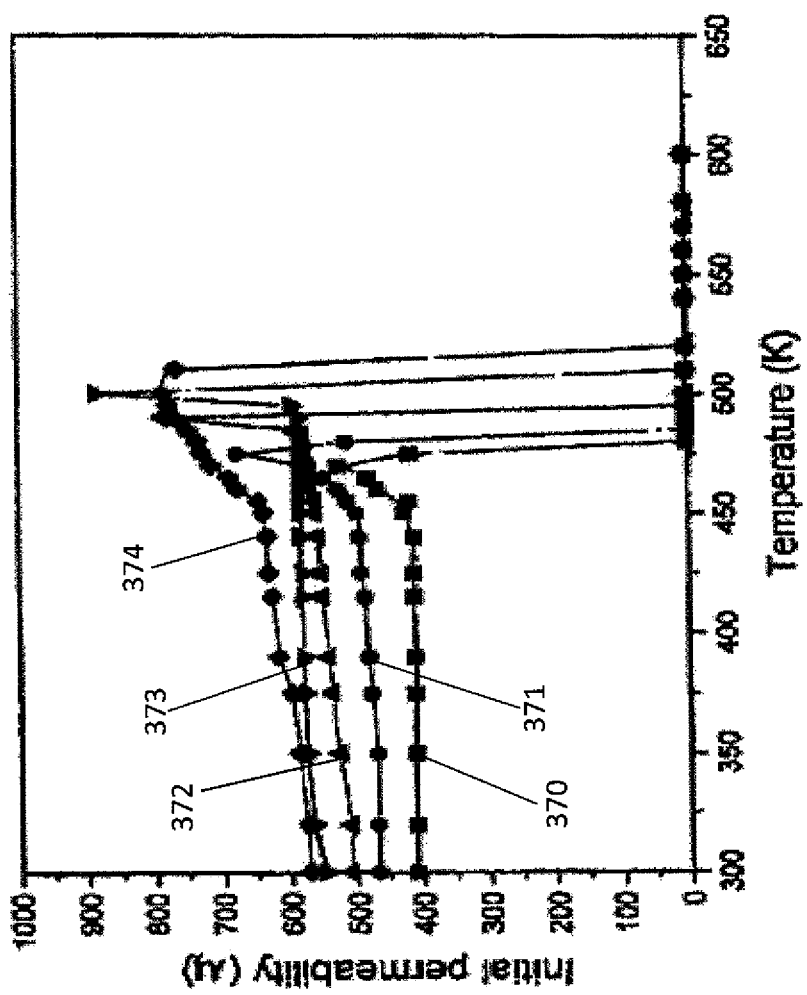
FIG. 8B illustrates the variation in the relative permeability as a function of temperature in a compositionally complex magnetic ferrite electroceramic having varying chemical compositions.

LCD alleviates these concerns through its ability to selectively deposit compositionally complex electroceramics that have atomic scale chemical uniformity and nanoscale microstructure controls. This enables the construction of circuitry that meets critical performance tolerances by maintaining dielectric values of the embedded passive components within ≤±1% of design specifications over standard operating temperatures. The combination of atomic scale chemical uniformity and nanoscale microstructure are strictly required when inserting a high permittivity ($\epsilon_R \geq 10$) electro ceramics. As shown in FIG. 8A, the dielectric constant of the barium strontium titanate ceramic remains stable over standard operating temperatures when its average grain size is less than 50 nanometer (nm) 360, but will vary by ±15% when the average grain size is 100 nm 361 and by ±40% when the average grain size is 200 nm 362. FIG. 8B depicts the initial permeability of a magnesium-copper-zinc-ferrite dielectric as a function of temperature for five different compositions, wherein the concentration of copper (Cu) is substituted for magnesium (Mg) according to the compositional formula $Mg_{(0.60-x)}Cu_{(x)}Zn_{(0.40)}Fe_2O_4$, with x=1 mol % 370, x=4 mol % 371, x=8 mol % 372, x=12 mol % 373, and x=14 mol % 374. Invariance in the permeability of magnetic materials is generally achieved in chemically complex compositions, and then only over narrow or specific compositional ranges, such as for x=1 mol % 370 and x=8 mol % 372 in the $Mg_{(0.60-x)}Cu_{(x)}Zn_{(0.40)}Fe_2O_4$ system. Although permeability is a function of microstructure, grain size has a more pronounced effect on loss. However, the atomic scale chemical uniformity and compositional precision of LCD methods is needed to maintain "critical tolerances" in the monolithic assembly over standard operating temperatures.

Figure 9:
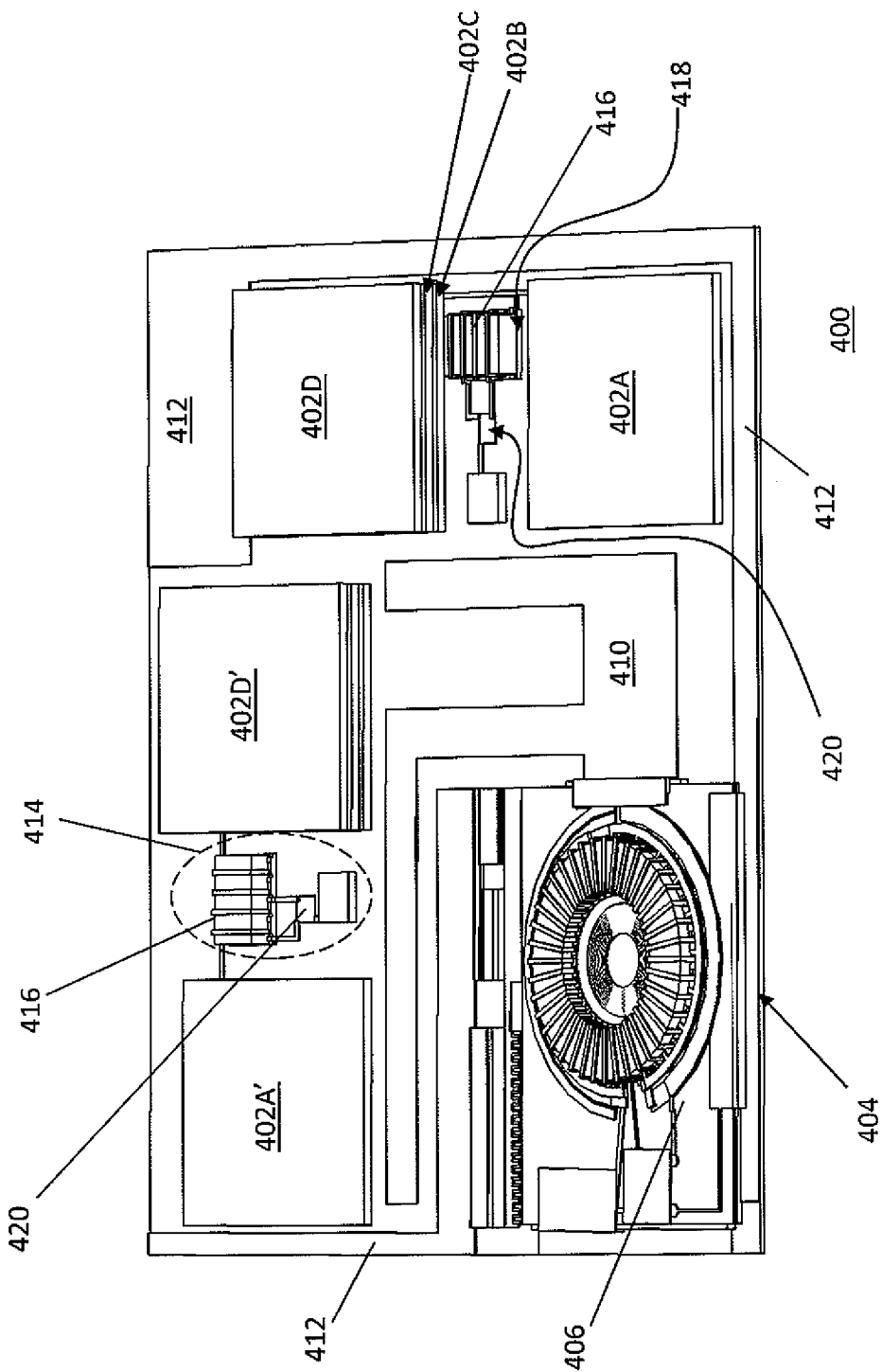
FIG. 9 shows a top perspective view of a semiconductor chip carrier that has a monolithic power management device and clock circuitry that remains stable with temperature integrated on to its surface.

In another aspect the present invention integrates monolithic power management modules and additional circuitry onto a semiconductor chip carrier to reduce power consumption and improve the utilization of multi-core processors used in computing and RF radio systems. FIG. 9 depicts a chip carrier 400 that holds a plurality of semiconductor die 402A, 402B, 402C, 402D, 402A', 402B', 402C', 402D' surface mounted on a semiconductor substrate 404. The semiconductor die may be mounted in stacks 402A', 402B', 402C', or configured as single die 402D'. At least one monolithic power management module 406 is co-located on the chip carrier surface. The monolithic power management module 406 may contain surface FET, but preferably contains a vertical FET with a resonant gate, as described above, to switch high current levels (≥50 A) at high speeds (≥100 MHz). The chip carrier 400 is used to deliver power to the various semiconductor die through power lines 410 and surface ground traces 412, and also has signal interconnects (not shown for clarity) to route data and control instructions between the various semiconductor die 402A, 402B, 402C, 402D, 402A', 402B', 402C', 402D'. The chip carrier 400 may additionally contain a variety of other low-level sensing, latching and bus circuitry (not shown for clarity) integrated on or into its surface, as well as additional circuitry assembled from passive components that have functional values that vary less than ±1% from their specified performance value over standard operating temperatures.

An additional aspect of the invention utilizes LCD methods to produce clock circuitry 414 that remains stable with temperature. The clock circuitry consists of a high-Q LCR resonator, where the self-resonance frequency is determined by the capacitance that develops between the windings of an inductor coil 416 mounted on an amorphous silica block 418 to minimize dielectric losses within the clock. It is also conceivable that the capacitance of the LCR resonator is derived from additional capacitive elements (not shown) that may comprise a phased locked loop array mounted on or embedded within the carrier's semiconductor substrate 404. The clock timing may be altered by integrating a switching element 420 into semiconductor chip carrier substrate 400 that provides the option to change the high-Q resonator's self-resonance frequency by routing the timing signal through different turns of the inductor coil 416.

Figure 10A:
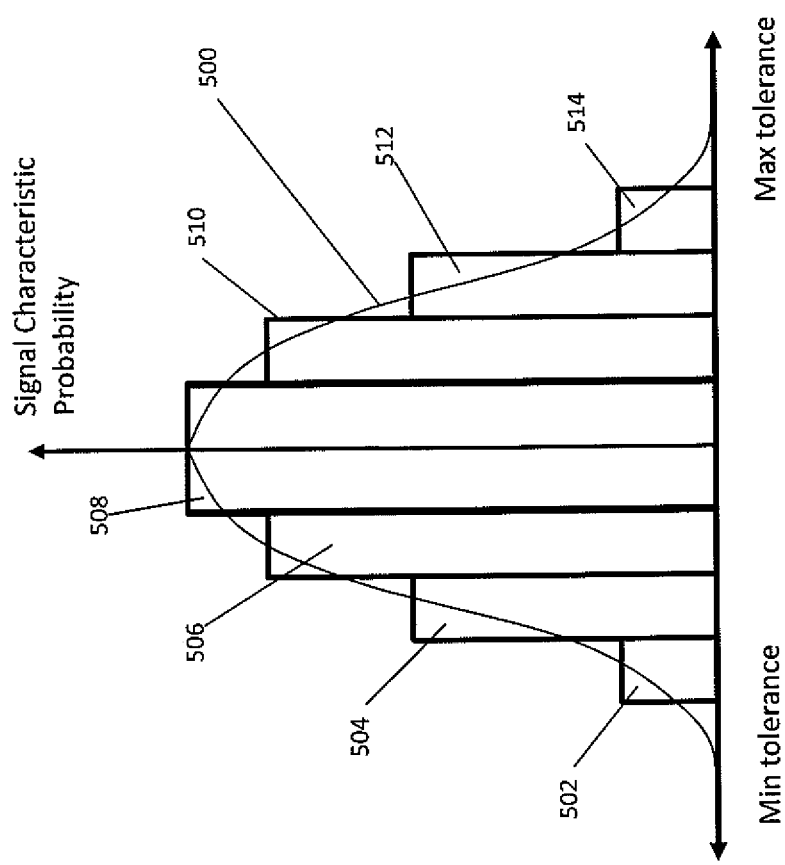
FIG. 10A illustrates a stochastic distribution in signal tuning caused by passive circuitry that has loose performance tolerances.
Figure 10B:
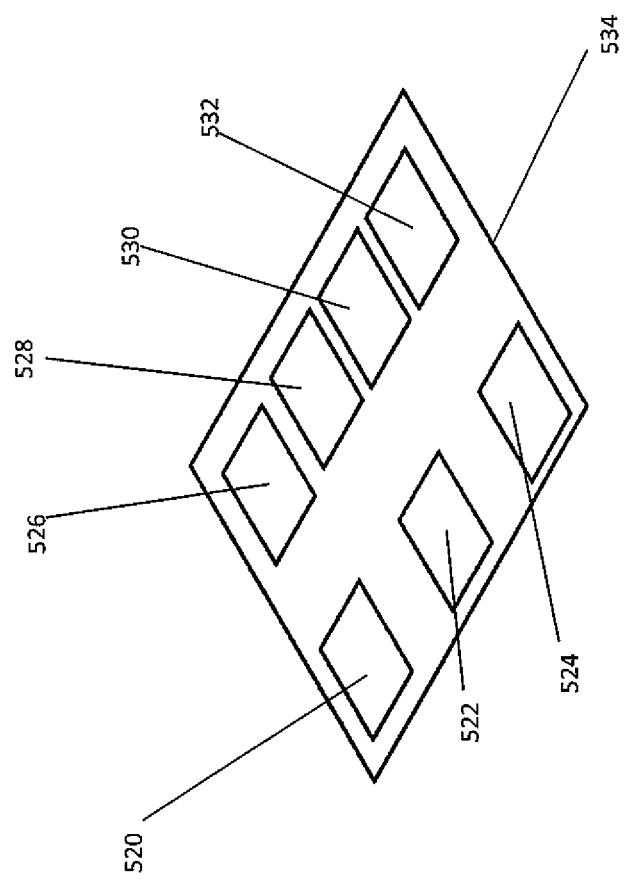
FIG. 10B depicts the redundant transistor banks that must be added to a semiconductor die to manage the stochastic distribution caused by passive circuitry having loose tolerances.

Reference is now made to FIGS. 10A,10B,11A,11B to illustrate a final embodiment of the invention that utilizes the tight tolerance passive circuitry monolithically integrated into the chip carrier 400 to reduce transistor counts, form factor, power consumption, and cost of semiconductor die 402A, 402B, 402C, 402D, 402A', 402B', 402C', 402D' surface mounted on the chip carrier's semiconductor substrate 404. Passive components, and filtering networks formed with them, are used to tune signal frequencies. Passive networks created from components that have loose tolerances, (performance values vary ≥±5%), require integrated circuit (IC) designers to design semiconductor die that accommodate all potential variations generated in the signals tuned by the loose tolerance components. This is done by breaking all anticipated tuning (amplitude and frequency/phase characteristics) of the processed signal into a bell curve 500, similar to that shown in FIG. 10A. The curve is broken up into performance segments 502,504,506,508,510,512,514 that dedicate transistor banks, or "buckets", that are specifically designed to allow the die to process signals falling into any one of the anticipated tunings defined by segments 502,504,506,508, 510,512,514. This causes a large number of redundant transistor assemblies 520,522,524,526,528,530,532 to be integrated into the semiconductor die 534, adding cost, size, wasted power to the circuit, as shown in FIG. 10B.

Figure 11A:
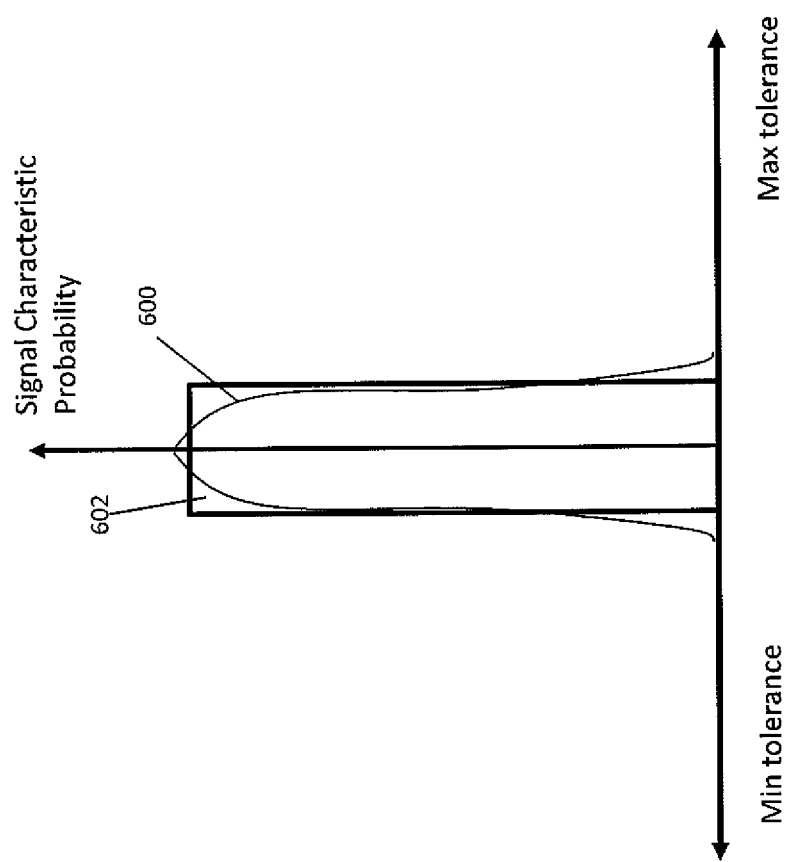
FIG. 11A illustrates a stochastic distribution in signal tuning resulting from passive circuitry that satisfies critical performance tolerances.
Figure 11B:
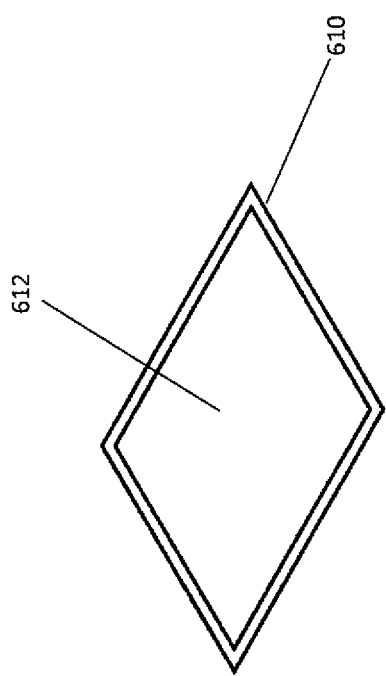
FIG. 11B depicts the transistor banks needed for a semiconductor die that is electrically interconnected with passive circuitry that satisfies critical performance tolerances.

As illustrated in FIGS. 11A,11B, the ability to integrate tight tolerance passive components, (performance values vary ≤±1%), into the chip carrier 400, eliminates this uncertainty, reducing the number performance segments 600 that need to be considered in the statistical distribution 602 of potential design tolerances. This aspect of the invention results in a significant reduction in the number of transistor banks or "buckets" 612 that need to be integrated into the semiconductor die 610, resulting a in a less sophisticated smaller form-factor, lower cost semiconductor when they can be integrated into fully integrated silicon chip carrier.

The present invention is illustratively described above in reference to the disclosed embodiments. Various modifications and changes may be made to the disclosed embodiments by persons skilled in the art without departing from the scope of the present invention as defined in the appended claims.

What is claimed is:

1. A monolithic power management module, comprising:
a first electrode;
a semiconductor layer disposed upon the first electrode;
a vertical power FET formed in the semiconductor layer to modulate currents through the semiconductor layer;
the FET having a second electrode disposed upon a surface of the semiconductor layer opposing the first electrode, and an insulated gate electrode inserted between the semiconductor layer and the first electrode; and
a toroidal inductor with a ceramic magnetic core formed on the semiconductor layer around the FET and the inductor having a first winding around the core and connected to the FET second electrode;
wherein windings of the toroidal inductor coil are in contact with an adjacent dielectric and comprise thin layers of electrical conductivity material that envelopes a mechanical constraining member including a low-expansion elemental metal having a measured hardness greater than 2× the measured hardness of the electrical conductivity material and a coefficient of thermal expansion that is within 25% of the coefficient of thermal expansion of the adjacent dielectric; and wherein the power FET includes an elongated gate electrode comprising a conductor that forms a resonant transmission line by configuring the conductor to form a serpentine electrode that contains a capacitive element determined by the charge collected beneath the gate, a resistive element determined by the conductor, length and cross-sectional area of the conductor used to form the serpentine gate electrode, and an inductive element formed by the half-turns that loop the serpentine winding back upon itself.

2. The module of claim 1 that is formed upon a semiconductor chip carrier.

3. The module of claim 2, wherein the semiconductor chip carrier includes passive ceramic components formed thereon that are electrically connected to the module.

4. The module of claim 2, further comprising:
a diode formed in the semiconductor layer peripherally to the toroidal inductor and connected to rectify current from the inductor;
and,
a capacitor having a ceramic dielectric formed on the semiconductor layer that is electrically connected to the diode.

5. The module of claim 2, further comprising clock circuitry formed on the chip carrier and comprising an oscillator coil formed on an amorphous silica layer, wherein the oscillator coil holds its inductance value to within 1% over the range of standard operating temperatures.

6. The module of claim 5, wherein the clock circuitry includes a switching element formed in the carrier for controlling a self-resonance frequency of the clock circuitry's oscillator coil.

7. The module of claim 1, wherein the power FET is a double-diffused MOSFET, a MUCHFET, V-groove MOSFET, a truncated V-groove MOSFET, a vertically configured HETFET, a MODFET, or an insulated gate bipolar transistor.

8. The module of claim 1, wherein the power FET includes a an elongated gate electrode having a gate width to gate length ratio that is equal to or exceeds 100, or alternatively $10^6$ to reduce its On-Resistance.

9. The module of claim 1, wherein the elongated gate electrode meanders over an area of the substrate located within a central opening of the toroidal inductor.

10. The insulated gate electrode of claim 1, wherein the insulator comprises amorphous silica.

11. The switch of claim 1, wherein the magnetic core consists of a ferrite electroceramic comprising cobalt (Co), nickel (Ni), zinc (Zn), copper (Cu), vanadium (V), magnesium (Mg), or lithium (Li).

12. The switch of claim 1, wherein the magnetic core consists of a hexaferrite electroceramic comprising magnesium (Mg), calcium (Ca), strontium (Sr), barium (Ba), scandium (Sc), copper (Cu), zinc (Zn), iron (Fe), bismuth (Bi), yttrium (Y), or aluminum (Al).

13. The switch of claim 1, wherein the magnetic core consists of a garnet electroceramic comprising calcium (Ca), magnesium (Mg), iron (Fe), strontium (Sr), scandium (Sc), manganese (Mn), barium (Ba), copper (Cu), zinc (Zn), aluminum (Al), bismuth (Hi), chromium (Cr), vanadium (V), zirconium (Zr), titanium (Ti), silicon (Si), Yttrium (Y), cobalt (Co), Gadolinium (Gd), neodymium (Nd), or holmium (Ho).

14. The magnetic core of claim 1 that consists of a compositionally complex magnetic material, wherein 100% of the grains have uniform grain size diameter that is less than 1.5× the mean grain size diameter.

15. The magnetic core of claim 14, wherein the mean grain size diameter is less than 5 μm, preferably having grain size in the range of 1 μm to 5 μm.

16. The switch of claim 1, wherein the toroidal inductor coil windings are interleaved within the windings of a transformer coil.

17. The transformer coil of claim 16, wherein a gap in the ceramic material comprising magnetic core is with ultra-low loss material, preferably amorphous silica material, to concentrate magnetic energy adjacent to at least one secondary coil winding and increase power coupling between the transformer's primary coil and secondary coil windings.

18. The inductor coil of claim 1, wherein the electrically conductive material is a superconductor material.

19. The inductor coil of claim 1, wherein the mechanical constraining member is tungsten, molybdenum, kovar, or invar.

* * * * *